(12) United States Patent
Shinohara et al.

(10) Patent No.: US 9,184,053 B2
(45) Date of Patent: Nov. 10, 2015

(54) SEMICONDUCTOR DEVICE AND METHOD OF MANUFACTURING THE SAME

(71) Applicant: Renesas Electronics Corporation, Kawasaki-shi (JP)

(72) Inventors: Hirofumi Shinohara, Kawasaki (JP); Hiromasa Yoshimori, Kawasaki (JP); Toshiaki Iwamatsu, Kawasaki (JP); Hidekazu Oda, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 55 days.

(21) Appl. No.: 13/735,857

(22) Filed: Jan. 7, 2013

(65) Prior Publication Data

US 2013/0175611 A1    Jul. 11, 2013

(30) Foreign Application Priority Data

Jan. 10, 2012   (JP) .................. 2012-002234

(51) Int. Cl.
| | |
|---|---|
| *H01L 27/092* | (2006.01) |
| *H01L 27/088* | (2006.01) |
| *H01L 21/70* | (2006.01) |
| *H01L 21/8234* | (2006.01) |
| *H01L 21/76* | (2006.01) |

(Continued)

(52) U.S. Cl.
CPC .... *H01L 21/02697* (2013.01); *H01L 21/82385* (2013.01); *H01L 21/823807* (2013.01); *H01L 21/823857* (2013.01); *H01L 21/823878* (2013.01); *H01L 27/088* (2013.01)

(58) Field of Classification Search
CPC ................. H01L 21/02697; H01L 21/823878; H01L 21/82385; H01L 21/823857; H01L 21/823807; H01L 21/823431; H01L 21/8239; H01L 27/088; H01L 27/0886; H01L 27/0922
USPC ........ 257/401, 334, 288, 368, 369, 371, 392, 257/393, E21.625; 438/424, 197, 275, 438/199–201, 258
See application file for complete search history.

(56) References Cited

U.S. PATENT DOCUMENTS

| | | | |
|---|---|---|---|
| 6,870,223 | B2 | 3/2005 | Kumagai et al. |
| 7,067,878 | B2 | 6/2006 | Ohyanagi et al. |
| 7,160,780 | B2 | 1/2007 | Lee et al. |

(Continued)

FOREIGN PATENT DOCUMENTS

| | | |
|---|---|---|
| JP | 2002-270825 A | 9/2002 |
| JP | 2005-353834 A | 12/2005 |

(Continued)

*Primary Examiner* — Fernando L Toledo
*Assistant Examiner* — Aaron Gray
(74) *Attorney, Agent, or Firm* — McGinn IP Law Group, PLLC

(57) ABSTRACT

An area in a top view of a region where a low-voltage field effect transistor is formed is reduced, and an area in a top view of a region where a high-voltage field effect transistor is formed is reduced. An active region where the low-voltage field effect transistors (first nMIS and first pMIS) are formed is constituted by a first convex portion of a semiconductor substrate that projects from a surface of an element isolation portion, and an active region where the high-voltage field effect transistors (second nMIS and second pMIS) are formed is constituted by a second convex portion of the semiconductor substrate that projects from the surface of the element isolation portion, and a trench portion formed in the semiconductor substrate.

16 Claims, 32 Drawing Sheets

(51) Int. Cl.
*H01L 21/02* (2006.01)
*H01L 21/8238* (2006.01)

(56) References Cited

U.S. PATENT DOCUMENTS

| | | |
|---|---|---|
| 7,265,008 B2 | 9/2007 | King et al. |
| 7,537,983 B2 | 5/2009 | Uchihara et al. |
| 7,851,340 B2 | 12/2010 | Brownson et al. |
| 7,973,361 B2 | 7/2011 | Sato et al. |
| 2005/0153490 A1 | 7/2005 | Yoon et al. |
| 2005/0272190 A1 | 12/2005 | Lee et al. |
| 2005/0285204 A1* | 12/2005 | Kim et al. ............... 257/368 |
| 2006/0214212 A1* | 9/2006 | Horita et al. ............ 257/300 |
| 2008/0157225 A1* | 7/2008 | Datta et al. ............. 257/401 |
| 2008/0164514 A1 | 7/2008 | Sugioka |
| 2008/0253170 A1* | 10/2008 | Inaba ...................... 365/154 |
| 2009/0090976 A1* | 4/2009 | Kavalieros et al. ..... 257/369 |
| 2009/0114971 A1* | 5/2009 | Cai et al. ................ 257/315 |
| 2009/0294874 A1 | 12/2009 | Lee |

FOREIGN PATENT DOCUMENTS

| | | |
|---|---|---|
| JP | 2006-245548 A | 9/2006 |
| JP | 4248548 B2 | 4/2009 |
| JP | 2009-105421 A | 5/2009 |
| JP | 2011-9296 A | 1/2011 |
| JP | 2011-14753 A | 1/2011 |

* cited by examiner

US 9,184,053 B2

SEMICONDUCTOR DEVICE AND METHOD OF MANUFACTURING THE SAME

CROSS-REFERENCE TO RELATED APPLICATION

The disclosure of Japanese Patent Application No. 2012-002234 filed on Jan. 10, 2012 including the specification, drawings and abstract is incorporated herein by reference in its entirety.

BACKGROUND

The present invention relates to a semiconductor device and a method of manufacturing the same and, in particular, to an effective technology when being applied to a semiconductor device and manufacturing thereof that are required for reducing a whole area of a semiconductor chip by reducing a size of a field effect transistor.

When field effect transistors used in various circuits constituting an SoC (System on Chip) are roughly classified according to circuit operation thereof, they can be classified into a low-voltage field effect transistor that has a thin gate insulating film and a short gate length and operates with a low voltage (for example, approximately 1.0 to 1.8 V), and a high-voltage field effect transistor that has a thick gate insulating film and a long gate length and operates with a high voltage (for example, approximately 3.3 to 5.0 V).

As a structure of the above-described low-voltage field effect transistor, for example, a fin-type has been proposed. For example, specification of U.S. Pat. No. 7,265,008 (Patent Document 1), specification of US Patent Application Publication No. 2005/0272190 (Patent Document 2), specification of US Patent Application Publication No. 2005/0153490 (Patent Document 3), specification of US Patent Application Publication No. 2009/0294874 (Patent Document 4), specification of U.S. Pat. No. 7,160,780 (Patent Document 5), specification of U.S. Pat. No. 7,851,340 (Patent Document 6), Japanese Patent Laid-Open No. 2011-14753 (Patent Document 7), and Japanese Patent Laid-Open No. 2011-9296 (Patent Document 8) disclose fin-type field effect transistors.

For example, Japanese Patent Laid-Open No. 2011-9296 (Patent Document 8) discloses a technology in which the fin-type field effect transistor has a plurality of fins formed on a first reference surface, and a plurality of fins formed on a second reference surface provided at a position higher than the first reference surface, and in which a distance between the two fins adjacent to each other with the first reference surface therebetween is formed larger than a distance between the two fins adjacent to each other with the second reference surface therebetween.

In addition, as the above-described high-voltage field effect transistor, there has been proposed, for example, a trench-type or a planar-type in which a concentration profile of a semiconductor region constituting a source/drain is optimized. For example, the specification of US Patent Application Publication No. 2008/0164514 (Patent Document 9) discloses a trench-type field effect transistor, and Japanese Patent Laid-Open No. 2002-270825 (Patent Document 10), Japanese Patent No. 4248548 (Patent Document 11), Japanese Patent Laid-Open No. 2005-353834 (Patent Document 12), Japanese Patent Laid-Open No. 2006-245548 (Patent Document 13), and Japanese Patent Laid-Open No. 2009-105421 (Patent Document 14) disclose the planar-type field effect transistor in which the concentration profile of the semiconductor region constituting the source/drain is optimized.

SUMMARY

An MCU (Micro Controller Unit) that is a kind of SoC is constituted by a plurality of circuits, such as a memory circuit, a logic circuit, and an I/O (Input/Output) circuit, and a field effect transistor according to circuit operation is used for the respective circuits. For example, a low-voltage field effect transistor is employed for a core transistor constituting the logic circuit, and a high-voltage field effect transistor is employed for an HV (High Voltage) transistor constituting the I/O circuit.

Meanwhile, in the MCU, further miniaturization of the field effect transistor has been desired for higher integration, higher functionality, and higher speed.

Currently, a gate length of the core transistor is approximately 30 nm, and normal transistor characteristics can be obtained even with a planar-type structure. However, when the gate length is reduced to 15 to 22 nm in accordance with a scaling rule in order to achieve higher integration, a short channel effect occurs in the planar-type structure, and thereby it becomes difficult to obtain the normal transistor characteristics. Consequently, it has been examined to employ a fin-type structure that can suppress the short channel effect even though the gate length is 15 to 22 nm.

In the fin-type field effect transistor, agate electrode surrounds a channel, and a size (channel width) of silicon constituting the channel in a top view can be set to 20 nm or smaller, so that controllability of a drain current by the gate electrode is better than in the planar-type field effect transistor, and short channel characteristics are excellent. In addition, whereas a channel through which a drain current flows is located over one plane in the planar-type field effect transistor, the channel is typically located over three planes (one top surface and two side surfaces) in the fin-type field effect transistor. Accordingly, a substantial channel area of the fin-type field effect transistor is larger than a substantial channel area of the planar-type field effect transistor even though an occupation area of the channel in the top view is the same, so that the drain current of the fin-type field effect transistor can be increased more than the drain current of the planar-type field effect transistor.

On the other hand, a power supply voltage is determined according to an external circuit in the HV transistor. Particularly, in an MCU incorporating a flash memory in a memory circuit, it is necessary to maintain the power supply voltage high in order to secure a high electric field required for memory operation. Therefore, it is difficult to simply reduce each size of the HV transistor in accordance with the scaling rule.

Accordingly, even if the core transistor is reduced in size by employing, for example, the fin-type field effect transistor, and an area of a circuit constituted by a plurality of the core transistors, such as a logic circuit, can be reduced, an area of a circuit constituted by a plurality of the HV transistors, such as, an I/O circuit, cannot be reduced. Therefore, it is difficult to reduce a whole area of a semiconductor chip from which the MCU is formed.

The embodiments have been made in view of the above circumstances and provide a technology that can reduce the whole area of the semiconductor chip.

Alternatively, the purpose is to provide a technology that can promote miniaturization of a field effect transistor formed in the semiconductor chip.

Particularly, an area in the top view of a region where a low-voltage field effect transistor is formed is reduced, and an area in the top view of a region where a high-voltage field effect transistor is formed is reduced.

The other purposes and the new feature will become clear from the description of the present specification and the accompanying drawings.

The following explains briefly one embodiment of a typical invention among the inventions disclosed in the present application.

This embodiment is a semiconductor device including: an element isolation portion having an insulating film formed on a main surface of a semiconductor substrate; a first field effect transistor formed in a first active region surrounded by the element isolation portion; and a second field effect transistor formed in a second active region surrounded by the element isolation portion. The first active region includes a first convex portion of the semiconductor substrate that projects from a surface of the element isolation portion, and the second active region includes a second convex portion of the semiconductor substrate that projects from the surface of the element isolation portion, and a trench portion formed in the semiconductor substrate. A height of the second convex portion from the surface of the element isolation portion and a height of the first convex portion from the surface of the element isolation portion are the same as each other, and a depth of the trench portion from the surface of the element isolation portion and a thickness of the element isolation portion are the same as each other.

In addition, this embodiment is a method of manufacturing a semiconductor device in which a first field effect transistor is formed in a first active region, and a second field effect transistor is formed in a second active region. The method includes the following steps of: (a) forming a first trench in an element isolation region of a main surface of a semiconductor substrate, and simultaneously, in the second active region, forming one or more second trenches that extend in a gate length direction of the second field effect transistor, in a gate width direction thereof; (b) burying an insulating film inside the first and second trenches; (c) covering regions other than the second active region with a resist pattern, and etching the insulating film until a thickness of the insulating film inside the second trench becomes a predetermined one, to allow the insulating film to remain inside the second trench of the second active region; (d) removing the resist pattern; (e) etching the insulating film until a thickness of the insulating film inside the first trench becomes a predetermined one to form an element isolation portion including the insulating film in the element isolation region, to form in the first active region a first convex portion including the semiconductor substrate that projects from a surface of the element isolation portion, and to form in the second active region a second convex portion including the semiconductor substrate that projects from the surface of the element isolation portion and a trench portion including the second trench; (f) forming a first gate insulating film having a first thickness on a surface of the first convex portion of the first active region, and forming a second gate insulating film having a second thickness larger than the first thickness on a surface of the second convex portion and a surface of the trench portion of the second active region; and (g) forming a first gate electrode having a first width through the first gate insulating film on a top surface and two opposing side surfaces of the first convex portion of the first active region, and forming a second gate electrode having a second width larger than the first width through the second gate insulating film on a top surface and two opposing side surfaces of the second convex portion and a bottom surface and two opposing side surfaces of the trench portion of the second active region.

The following explains briefly the effect acquired by one embodiment of the typical invention among the inventions disclosed in the present application.

The whole area of the semiconductor chip can be reduced.

Alternatively, miniaturization of the field effect transistor formed in the semiconductor chip can be promoted.

Particularly, the area in the top view of the region where the low-voltage field effect transistor is formed can be reduced, and the area in the top view of the region where the high-voltage field effect transistor is formed can be reduced.

DETAILED DESCRIPTION

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In addition, in the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. are referred to, what resembles or is similar to the shape substantially shall be included, except for the case where it is clearly specified in particular and where it is considered to be clearly not right from a theoretical point of view. This statement also applies to the numeric value and range described above.

Moreover, in all the drawings used in the following embodiments, in order to make a drawing intelligible, hatching may be attached even if it is a plan view. In addition, in the following embodiments, an MISFET (Metal Insulator Semiconductor Field Effect Transistor) representing a field effect transistor is abbreviated as an MIS, a p-channel type MISFET is a pMIS, and an n-channel type MISFET is an nMIS. Furthermore, in the following embodiments, a wafer mainly refers to an Si (Silicon) single crystal wafer, but it is not limited to this, and it shall refer to an insulating film substrate for forming an SOI (Silicon On Insulator) wafer and an integrated circuit thereon, etc. A shape of the wafer is not limited to a circular or substantially circular one, either, but a square, a rectangle, etc. shall be included.

In addition, in all the drawings for explaining the following embodiments, the same symbol is attached to the same member having the same function, as a principle, and the repeated explanation thereof is omitted. Hereinafter, embodiments of the present invention will be explained in detail based on the drawings.

First Embodiment

Semiconductor Device

Figure 1:
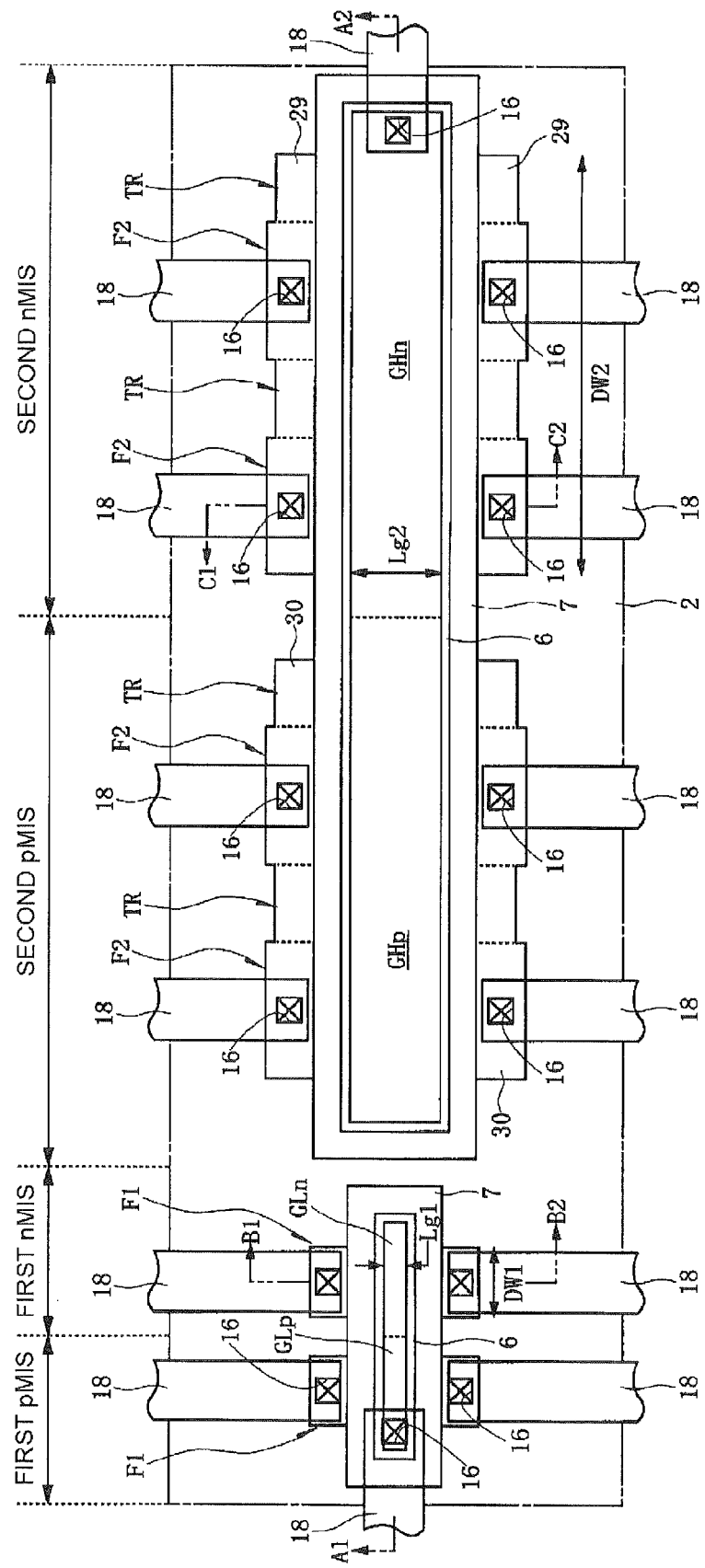
FIG. 1 is a main part plan view of a semiconductor device according to a first embodiment of the present invention.
Figure 2:
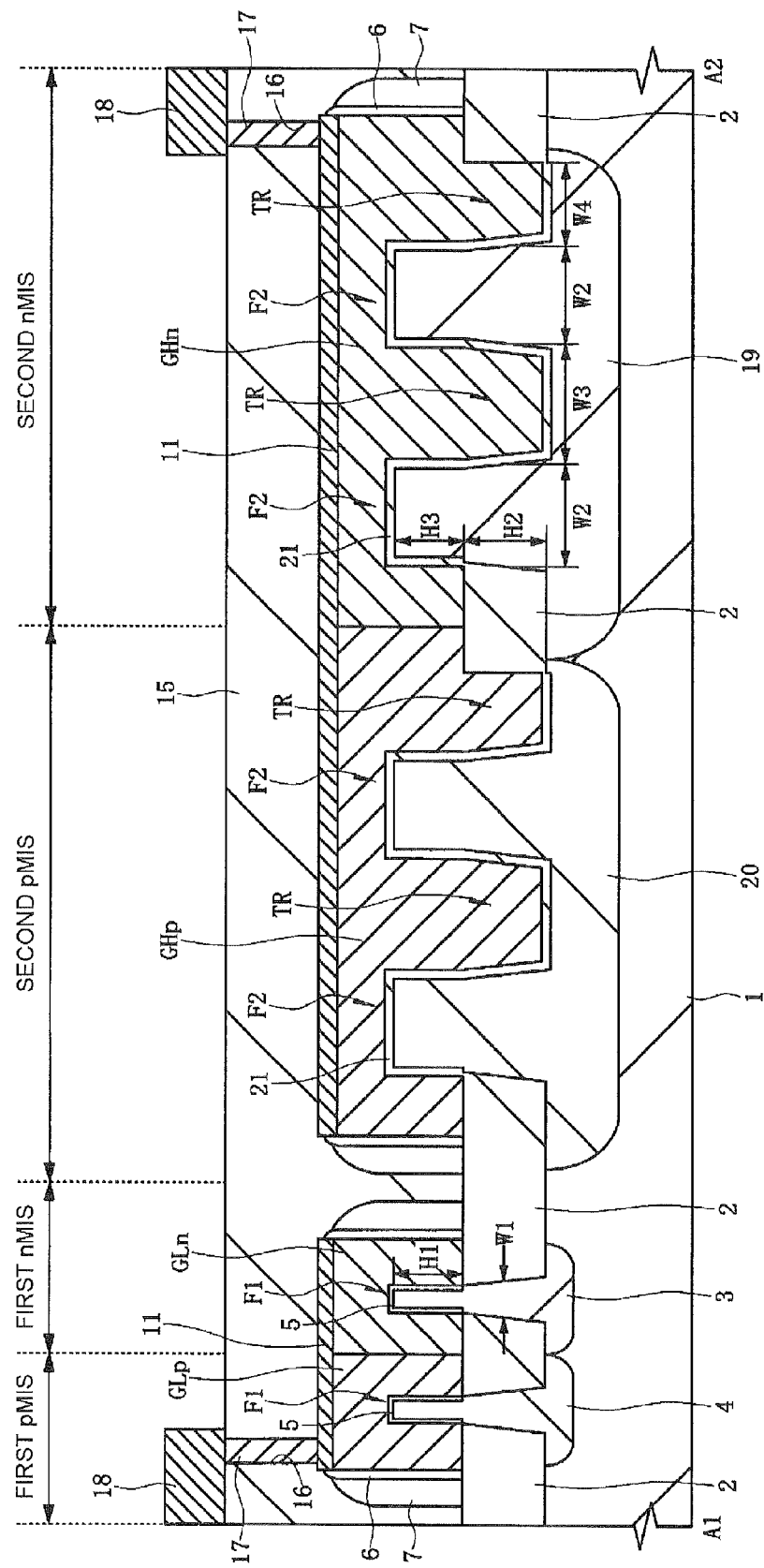
FIG. 2 is a main part sectional view (main part sectional view taken along a line A1-A2 of FIG. 1) of the semiconductor device according to the first embodiment of the present invention.
Figure 3A:
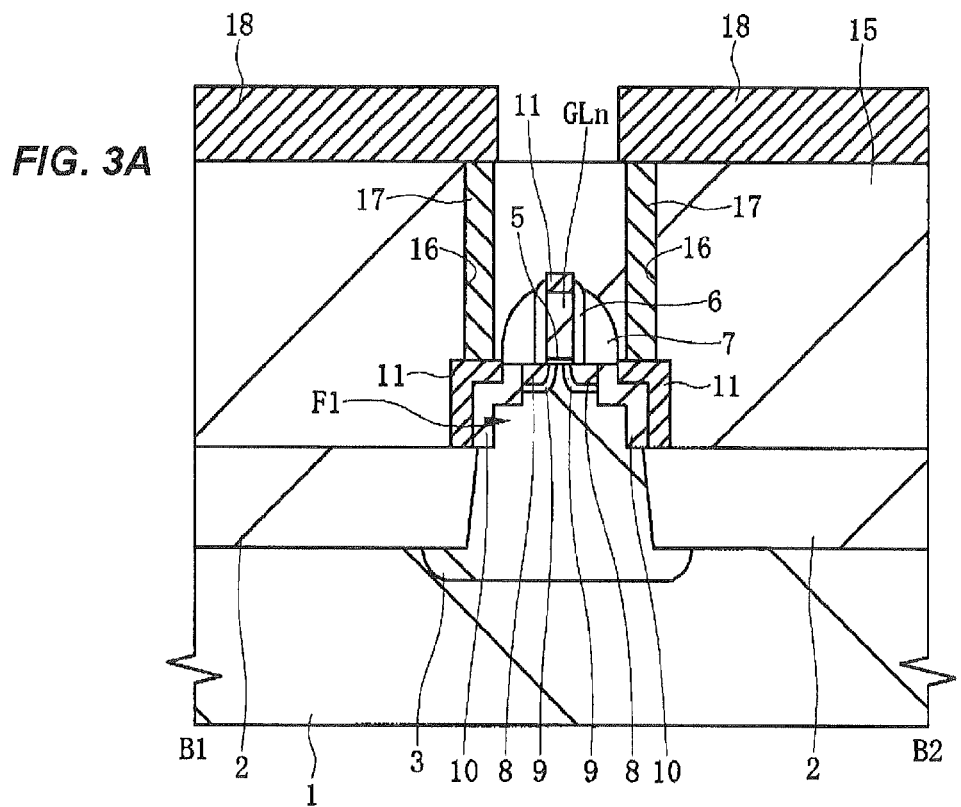
FIGS. 3A and 3B are main part sectional views of the semiconductor device according to the first embodiment of the present invention (FIG. 3A is the main part sectional view taken along a line B1-B2 of FIG. 1, and FIG. 3B is the main part sectional view taken along a line C1-C2 of FIG. 1)
Figure 3B:
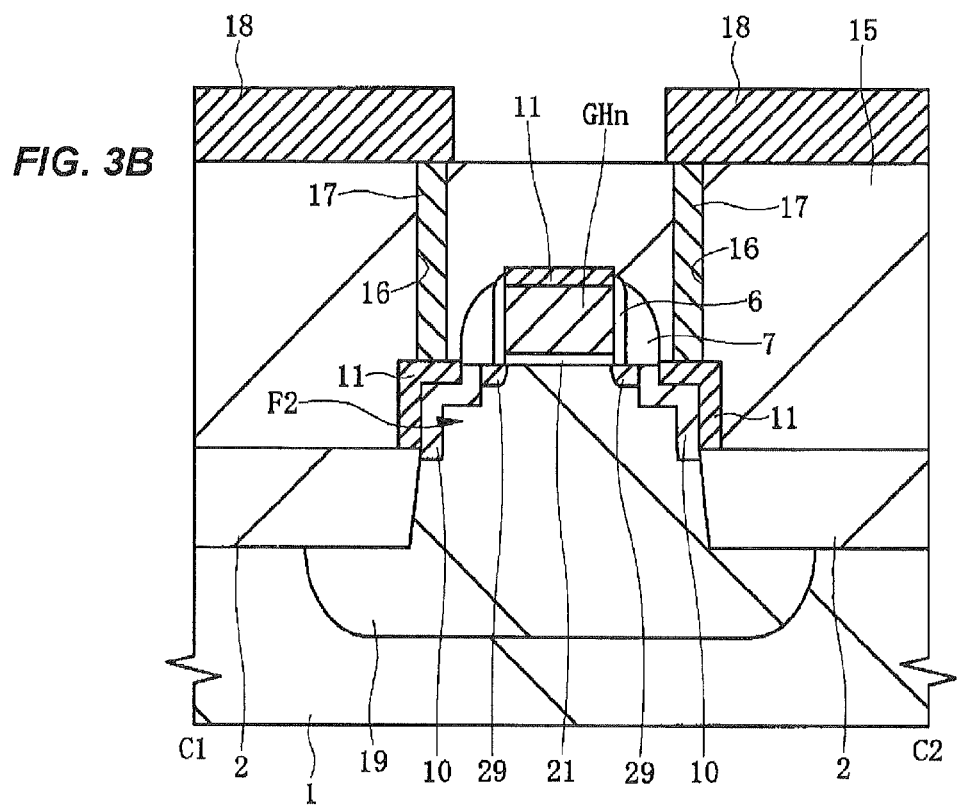

A structure of a semiconductor device according to a first embodiment will be explained using FIGS. 1 to 3. FIG. 1 is a main part plan view of the semiconductor device, and shows a main part plane of a first nMIS, a first pMIS, a second nMIS, and a second pMIS. FIG. 2 is a main part sectional view of the semiconductor device, and shows a main part cross section (cross section taken along a line A1-A2 of FIG. 1) cut along a gate width direction of the first nMIS, the first pMIS, the second nMIS, and the second pMIS. In addition, FIGS. 3A and 3B are main part sectional views of the semiconductor device, FIG. 3A shows a main part cross section (cross section taken along a line B1-B2 of FIG. 1) cut along a gate length direction of the first nMIS, and FIG. 3B shows a main part cross section (cross section taken along a line C1-C2 of FIG. 1) cut along a gate length direction of the second nMIS.

Here, the first nMIS and the first pMIS are low-voltage MISs that operate at a relatively low voltage, for example, approximately 1.0 to 1.8 V, and are, for example, an n-channel type core transistor and a p-channel type core transistor that are used for a logic circuit of an MCU, respectively. In addition, the second nMIS and the second pMIS are high-voltage MISs that operate at a relatively high voltage, for example, approximately 3.3 to 5 V, and are, for example, an n-channel type HV transistor and a p-channel type HV transistor that are used for an I/O circuit of the MCU, respectively.

First, configurations of the first nMIS (for example, the n-channel type core transistor) and the first pMIS (for example, the p-channel type core transistor) according to the first embodiment will be explained.

An element isolation portion 2 is formed on a main surface of a semiconductor substrate 1 where the first nMIS and the first pMIS are formed. The element isolation portion 2 has a function to prevent interference between elements formed on the semiconductor substrate 1, and it is, for example, formed by an STI (Shallow Trench Isolation) method in which a trench is formed in the semiconductor substrate 1, and in which an insulating film is buried inside this trench. An active region isolated by the element isolation portion 2 forms a first nMIS region or a first pMIS region. The above-described insulating film buried inside the trench is, for example, an HARP (High Aspect Ratio Process) oxide film, an HDP (High Density Plasma) oxide film, or a polysilazane ($SiH_2NH$) oxide film. A width of the element isolation portion 2 formed between the first nMIS and the first pMIS is set to a value that can prevent interference therebetween.

An active region of the semiconductor substrate 1 includes a convex portion projecting from a top surface (surface) of the element isolation portion 2, and one first convex portion F1 is formed in the first nMIS region and the first pMIS region, respectively. A width (W1) of the first convex portion F1 is, for example, not more than 50 nm, and a height (H1) is, for example, approximately 150 nm. A channel and a source/drain of the first nMIS are formed at the first convex portion F1 formed in the first nMIS region, and a channel and a source/drain of the first pMIS are formed at the first convex portion F1 formed in the first pMIS region.

A p-type well 3 that is a semiconductor region is formed on the main surface of the semiconductor substrate 1 including the first convex portion F1 of the first nMIS region, and an n-type well 4 that is the semiconductor region is formed on the main surface of the semiconductor substrate 1 including the first convex portion F1 of the second pMIS region. A p-type impurity, such as B (boron), is introduced into the p-type well 3, and an n-type impurity, such as P (phosphorus) or As (arsenic), is introduced into the n-type well 4. In both the p-type well 3 and the n-type well 4, an impurity concentration on a main surface side of the semiconductor substrate 1 is set high.

In the first nMIS region, a gate electrode GLn having a constant width (gate length) is formed through a gate insulating film 5 so as to cover a surface (a top surface and two opposing side surfaces) of the first convex portion F1. The gate electrode GLn is, for example, constituted by polycrystalline Si (silicon) into which the n-type impurity has been introduced. Similarly, in the first pMIS region, a gate electrode GLp having a constant width (gate length) is formed through the gate insulating film 5 so as to cover the surface (the top surface and the two opposing side surfaces) of the first convex portion F1. The gate electrode GLp is, for example, constituted by polycrystalline Si into which the p-type impurity has been introduced. The gate insulating film 5 is, for example, an oxide film, and a thickness thereof is approximately 2 to 3 nm. Widths (Lg1) of the gate electrodes GLn and GLp, i.e., the gate lengths, are, for example, approximately 15 to 20 nm.

As described above, the first convex portion F1 is set as the active region, and thereby substantial gate widths of the first nMIS and the first pMIS can be made wide. When the width (W1) of the first convex portion F1 and the height (H1) of the first convex portion F1 are used, a substantial gate width (Weff) is expressed with Weff=W1+H1×2, and it is larger than the gate width (DW1) in a top view.

$$Weff=W1+H1\times 2>DW1$$

Further, for example, an offset sidewall 6 and a sidewall 7 both including the insulating film are formed on both sidewalls of the gate electrode GLn of the first nMIS in that order from the inside. On the semiconductor substrate 1 (p-type well 3) of the first convex portion F1 directly under these offset sidewall 6 and sidewall 7, a first n-type diffusion layer 8 that is the semiconductor region and a p-type halo diffusion layer 9 are formed, the p-type halo diffusion layer 9 being formed so as to surround the first n-type diffusion layer 8, and a second n-type diffusion layer 10 is formed outside the first n-type diffusion layer 8. The n-type impurity, such as P or As, is introduced into the first n-type diffusion layer 8 and the second n-type diffusion layer 10, and the n-type impurity is introduced into the second n-type diffusion layer 10 at a higher concentration compared with the first n-type diffusion layer 8. The source/drain of the first nMIS having an LDD (Lightly Doped Drain) structure is formed by the first n-type diffusion layer 8 and the second n-type diffusion layer 10.

Although not shown, in the semiconductor substrate 1 (p-type well 3) sandwiched between the two sources/drains directly under the gate electrode GLn, formed is a channel into which an impurity for adjusting a threshold of the first nMIS has been introduced.

Similarly, on both sidewalls of the gate electrode GLp of the first pMIS, for example, the offset sidewall 6 and the sidewall 7 both including the insulating film are formed in that order from the inside. On the semiconductor substrate 1 (n-type well 4) of the first convex portion F1 directly under these offset sidewall 6 and sidewall 7, although not shown, a first p-type diffusion layer that is the semiconductor region and an n-type halo diffusion layer are formed, the n-type halo diffusion layer being formed so as to surround the first p-type diffusion layer, and a second p-type diffusion layer is formed outside the first p-type diffusion layer. The p-type impurity, such as B, is introduced into the first p-type diffusion layer and the second p-type diffusion layer, and the p-type impurity is introduced into the second p-type diffusion layer at a higher concentration compared with the first p-type diffusion layer. The source/drain of the first pMIS having the LDD structure is formed by the first p-type diffusion layer and the second p-type diffusion layer.

In addition, although not shown, in the semiconductor substrate 1 (n-type well 4) sandwiched between the two sources/drains directly under the gate electrode GLp, formed is a channel into which an impurity for adjusting a threshold of the first pMIS has been introduced.

Further, a silicide film 11 is formed on top surfaces of the gate electrode GLn and the second n-type diffusion layer 10 of the first nMIS, and on top surfaces of the gate electrode GLp and the second n-type diffusion layer of the first pMIS. This silicide film 11 is, for example, an NiSi (nickel silicide) film, an NiPtSi (nickel platinum silicide) film, or a PtSi (platinum silicide) film.

Additionally, the first nMIS and the first pMIS are covered with an interlayer film 15, and a wiring layer 18 is formed over the interlayer film 15. A contact hole 16 is formed in a predetermined part of the interlayer film 15, and the gate electrode GLn or the source/drain of the first nMIS, or the gate electrode GLp or the source/drain of the first pMIS, and the wiring layer 18 are electrically connected to each other through a plug 17 formed inside the contact hole 16.

Next, will be explained configurations of the second nMIS (for example, an n-channel type HV transistor) and the second pMIS (for example, a p-channel type HV transistor) according to the first embodiment.

The element isolation portion 2 is formed on the main surface of the semiconductor substrate 1 in which the second nMIS and the second pMIS are formed, and similarly to the first nMIS region and the first pMIS region, an active region isolated by the element isolation portion 2 forms a second nMIS region or a second pMIS region.

However, the active region of the semiconductor substrate 1 includes a second convex portion F2 projecting from a top surface (surface) of the element isolation portion 2, and a trench portion TR formed in the semiconductor substrate 1, and one or more second convex portions F2 and one or more trench portions TR are alternately formed in the gate width direction in the second nMIS region and the second pMIS region, respectively. A height (H3) of the second convex portion F2 is the same as the height (H1) of the first convex portion F1, and it is, for example, approximately 150 nm. In addition, a depth (H2) of the trench portion TR is the same as a thickness of the element isolation portion 2, and it is, for example, approximately 150 nm. A channel and a source/drain of the second nMIS are formed at the second convex portion F2 and the trench portion TR that are formed in the second nMIS region, and a channel and a source/drain of the second pMIS are formed at the second convex portion F2 and the trench portion TR that are formed in the second pMIS region.

Figure 4:
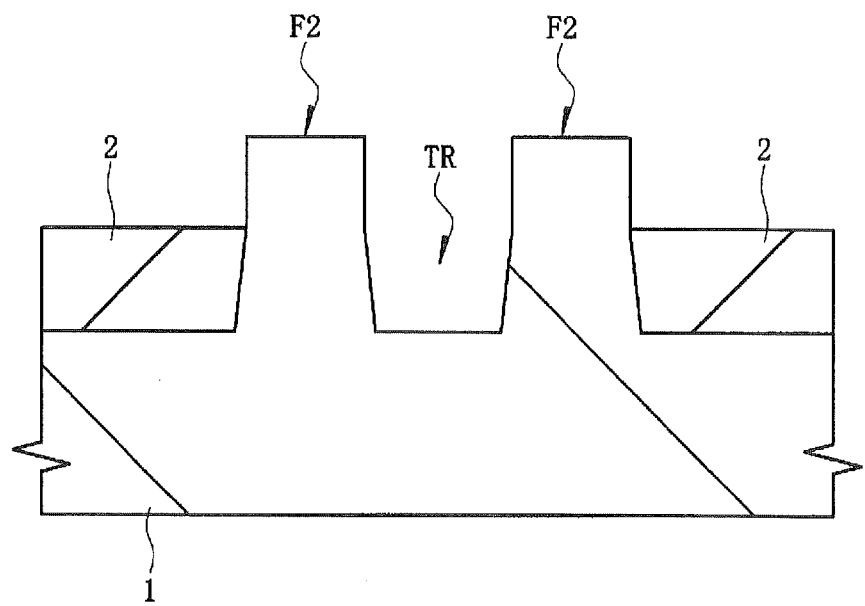
FIG. 4 is a main part sectional view showing a first modified example of a structure of a high-voltage field effect transistor according to the first embodiment of the present invention.
Figure 5:
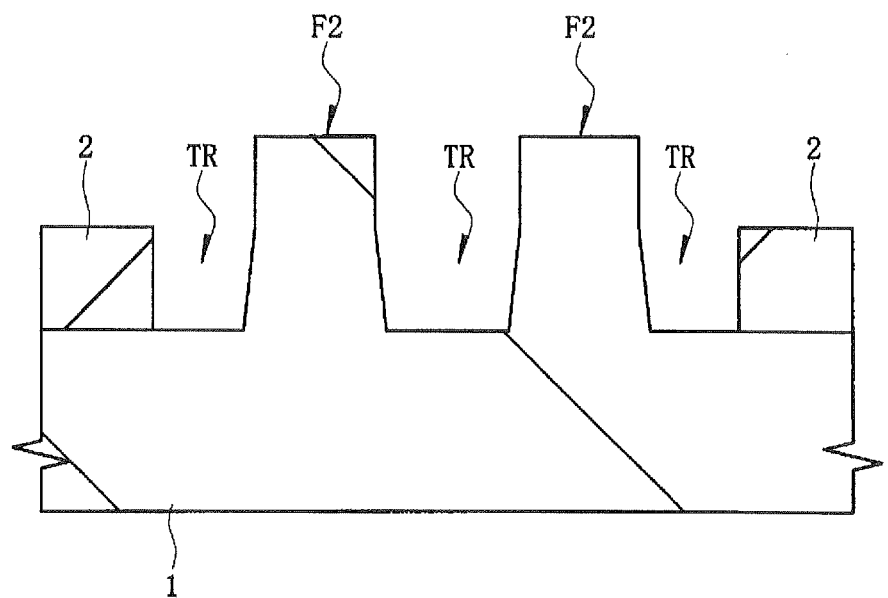
FIG. 5 is a main part sectional view showing a second modified example of the structure of the high-voltage field effect transistor according to the first embodiment of the present invention.

Here, a structure is exemplified in which the second convex portion F2 is formed at one end of the active region in the gate width direction, the trench portion TR is formed at the other end thereof, and two second convex portions F2 and one and an approximately half trench portions TR are formed, but the present invention is not limited to this. For example, as shown in FIG. 4, the second convex portion F2 may be formed at both ends of the active region in the gate width direction, or as shown in FIG. 5, the trench portion TR may be formed at both ends of the active region in the gate width direction.

A p-type well 19 that is the semiconductor region is formed on the main surface of the semiconductor substrate 1 including the second convex portion F2 and the trench portion TR of the second nMIS region, and an n-type well 20 that is the semiconductor region is formed on the main surface of the semiconductor substrate 1 including the second convex portion F2 and the trench portion TR of the second pMIS region. A p-type impurity, such as B, is introduced into the p-type well 19, and the n-type impurity, such as P or As, is introduced into the n-type well 20. Impurity concentrations of both the p-type well 19 and the n-type well 20 are set to be substantially uniform.

In the second nMIS region, a gate electrode GHn having a constant width (gate length) is formed through the gate insulating film 21 so as to cover a surface (a top surface and two opposing side surfaces) of the second convex portion F2 and a surface (a bottom surface and two opposing side surfaces) of the trench portion TR. The gate electrode GHn is, for example, constituted by polycrystalline Si into which the n-type impurity has been introduced. Similarly, in the second pMIS region, a gate electrode GHp having a constant width (gate length) is formed through the gate insulating film 21 so as to cover the surface (the top surface and the two opposing side surfaces) of the second convex portion F2 and the surface (the bottom surface and the two opposing side surfaces) of the trench portion TR. The gate electrode GHp is, for example, constituted by polycrystalline Si into which the p-type impurity has been introduced. The gate insulating film 21 is, for example, an oxide film, and a thickness thereof is approximately 15 nm. Widths (Lg2) of the gate electrodes GHn and GHp, i.e., the gate lengths, are, for example, approximately 100 nm.

As described above, the second convex portion F2 and the trench portion TR are set as the active region, and thereby substantial gate widths of the second nMIS and the second pMIS can be made wide. For example, in a case of the active region including two second convex portions F2 and one and an approximately half trench portions TR, when the width (W2) of the second convex portion F2, the height (H3) of the second convex portion F2, widths (W3, W4) of the trench portion TR, and the depth (H2) of the trench portion TR are used, a substantial gate width (Weff) is expressed with Weff=W2×2+W3+W4+H3×4+H2×3, and it is larger than the gate width (DW2) in the top view.

$$Weff = W2 \times 2 + W3 + W4 + H3 \times 4 + H2 \times 3 > DW2$$

Further, for example, the offset sidewall 6 and the sidewall 7 both including the insulating film are formed on both sidewalls of the gate electrode GHn of the second nMIS in that order from the inside. On the semiconductor substrate 1 (p-type well 19) of the second convex portion F2 and the trench portion TR directly under these offset sidewall 6 and sidewall 7, a first n-type diffusion layer 29 that is the semiconductor region is formed, and the second n-type diffusion layer 10 is formed outside the first n-type diffusion layer 29. A source/drain of the second nMIS having the LDD structure is formed by the first n-type diffusion layer 29 and the second n-type diffusion layer 10.

Although not shown, in the semiconductor substrate 1 (p-type well 19) sandwiched between the two sources/drains directly under the gate electrode GHn, formed is a channel into which an impurity for adjusting a threshold of the second nMIS has been introduced.

Similarly, for example, the offset sidewall 6 and the sidewall 7 both including the insulating film are formed on both sidewalls of the gate electrode GHp of the second pMIS in that order from the inside. On the semiconductor substrate 1 (n-type well 20) of the second convex portion F2 and the trench portion TR directly under these offset sidewall 6 and sidewall 7, although not shown, the first p-type diffusion layer that is the semiconductor region is formed, and the second p-type diffusion layer is formed outside the first p-type diffusion layer. A source/drain of the second pMIS having the LDD structure is formed by the first p-type diffusion layer and the second p-type diffusion layer.

In addition, although not shown, in the semiconductor substrate 1 (n-type well 20) sandwiched between the two sources/drains directly under the gate electrode GHp, formed is a channel into which an impurity for adjusting a threshold of the second pMIS has been introduced.

Further, the silicide film 11 is formed on top surfaces of the gate electrode GHn and the second n-type diffusion layer 10 of the second nMIS, and on top surfaces of the gate electrode GHp and the second n-type diffusion layer of the second pMIS.

Further, the second nMIS and the second pMIS are covered with the interlayer film 15, and the wiring layer 18 is formed over the interlayer film 15. The contact hole 16 is formed in a predetermined part of the interlayer film 15, and the gate electrode GHn or the source/drain of the second nMIS, or the gate electrode GHp or the source/drain of the second pMIS, and the wiring layer 18 are electrically connected to each other through the plug 17 formed inside the contact hole 16.

As described above, in the first nMIS and the first pMIS that are low-voltage MISs, the top surface and the two opposing side surfaces of the first convex portion F1 are used for the channel through which a drain current flows, thereby as compared with a planar-type MIS in the related art, a substantial gate width (channel width) is larger, and the drain current increases. In addition, even in the second nMIS and the second pMIS that are high-voltage MISs, the top surface and the two opposing side surfaces of the second convex portion F2, and the bottom surface and the two opposing side surfaces of the trench portion TR are used for the channel through which the drain current flows, thereby as compared with the planar-type MIS in the related art, the substantial gate width (channel width) is larger, and the drain current increases. Namely, if the drain current is made to be the same as in the planar-type MIS in the related art, areas of the first nMIS, the first pMIS, the second nMIS, and the second pMIS can be made smaller than an area of the planar-type MIS in the related art, so that the whole area of the semiconductor chip can be reduced. In addition, in the first nMIS and the first pMIS that are low-voltage MISs, the gate electrodes GLn and GLp are formed so as to cover the surface (the top surface and the two opposing side surfaces) of the first convex portion F1 even though the width (W1) of the first convex portion F1 is set to be not more than 50 nm, so that a tolerance to the short channel effect is high, and so that normal transistor characteristics can be obtained, for example, even though the gate length is approximately 15 to 20 nm.

<<Method of Manufacturing Semiconductor Device>>

Next, a method of manufacturing the semiconductor device according to the first embodiment will be explained in step order using FIGS. 6 to 26. FIGS. 6 to 20 are main part sectional views of the first nMIS, the first pMIS, the second nMIS, and the second pMIS during manufacturing steps of the semiconductor device, and show a main part cross section (the above-mentioned cross section taken along the line A1-A2 of FIG. 1) obtained by cutting the channel along the gate width direction of each gate electrode. In addition, FIGS. 21 to 26 are main part plan views of the first nMIS, the first pMIS, the second nMIS, and the second pMIS during the manufacturing steps of the semiconductor device. The first nMIS and the first pMIS are, for example, the n-channel type core transistor and the p-channel type core transistor that are used for the logic circuit of the MCU, respectively, and the second nMIS and the second pMIS are, for example, the n-channel type HV transistor and the p-channel type HV transistor that are used for the I/O circuit of the MCU, respectively.

<Convex Portion and Trench Portion Forming Step>

Figure 6:
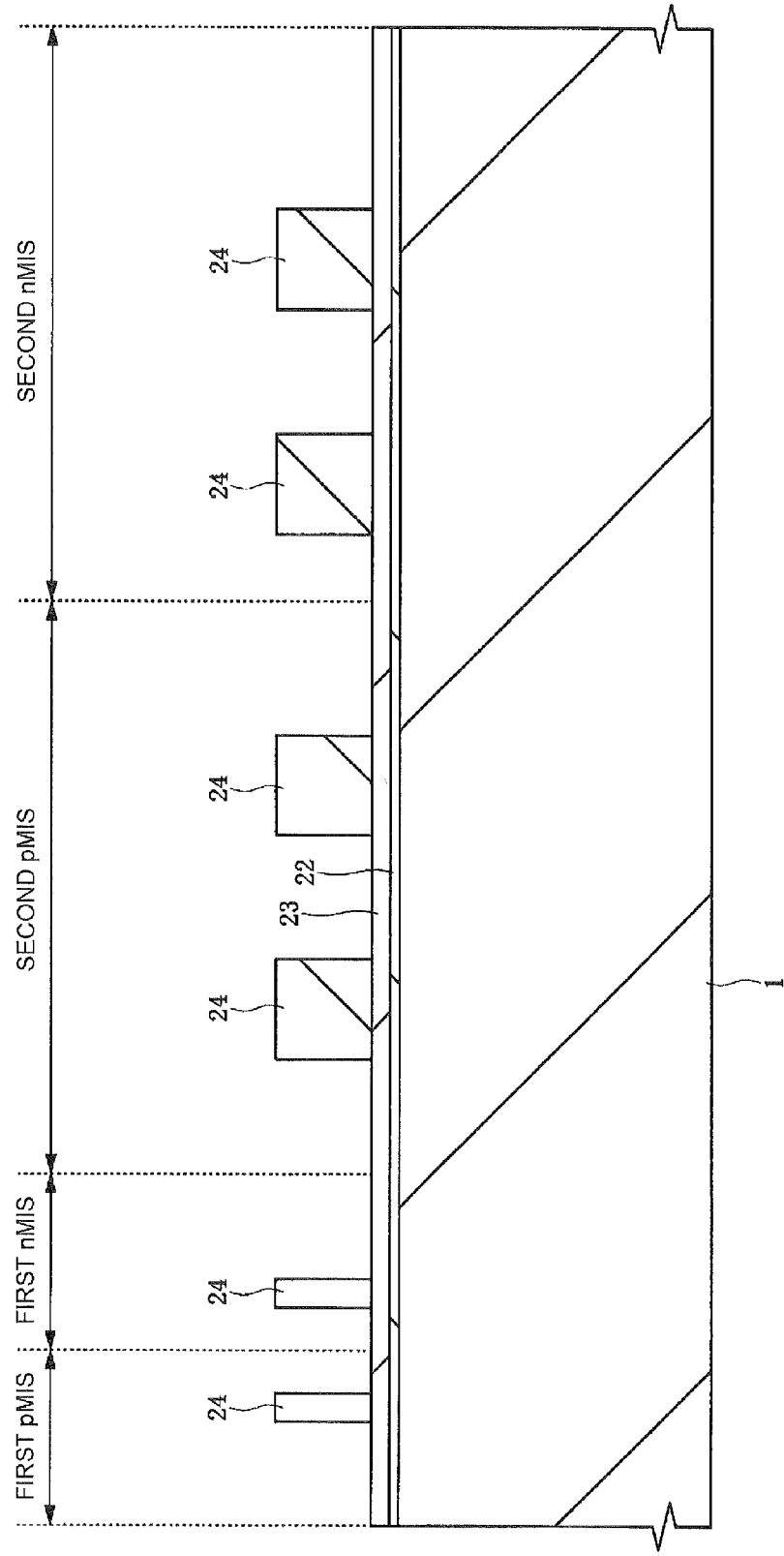
FIG. 6 is a main part sectional view of a semiconductor substrate showing a manufacturing step of the semiconductor device according to the first embodiment of the present invention.

First, as shown in FIG. 6, prepared is the semiconductor substrate (a thin plate of a semiconductor having a substantially circular flat surface, which is referred to as a semiconductor wafer in this stage) 1 for which, for example, a p-type impurity, such as B, has been introduced into, for example, a single crystal Si. Subsequently, an $SiO_2$ film 22 and an $Si_3N_4$ film 23 are sequentially formed over the main surface of the semiconductor substrate 1. A thickness of the $SiO_2$ film 22 is, for example, approximately 10 nm, and a thickness of the $Si_3N_4$ film 23 is, for example, approximately 40 nm. Subsequently, using a photolithography method, a resist pattern 24 is formed, covering regions other than an element isolation region and a region of the second nMIS region and the second pMIS region where trench portions are formed.

Figure 7:
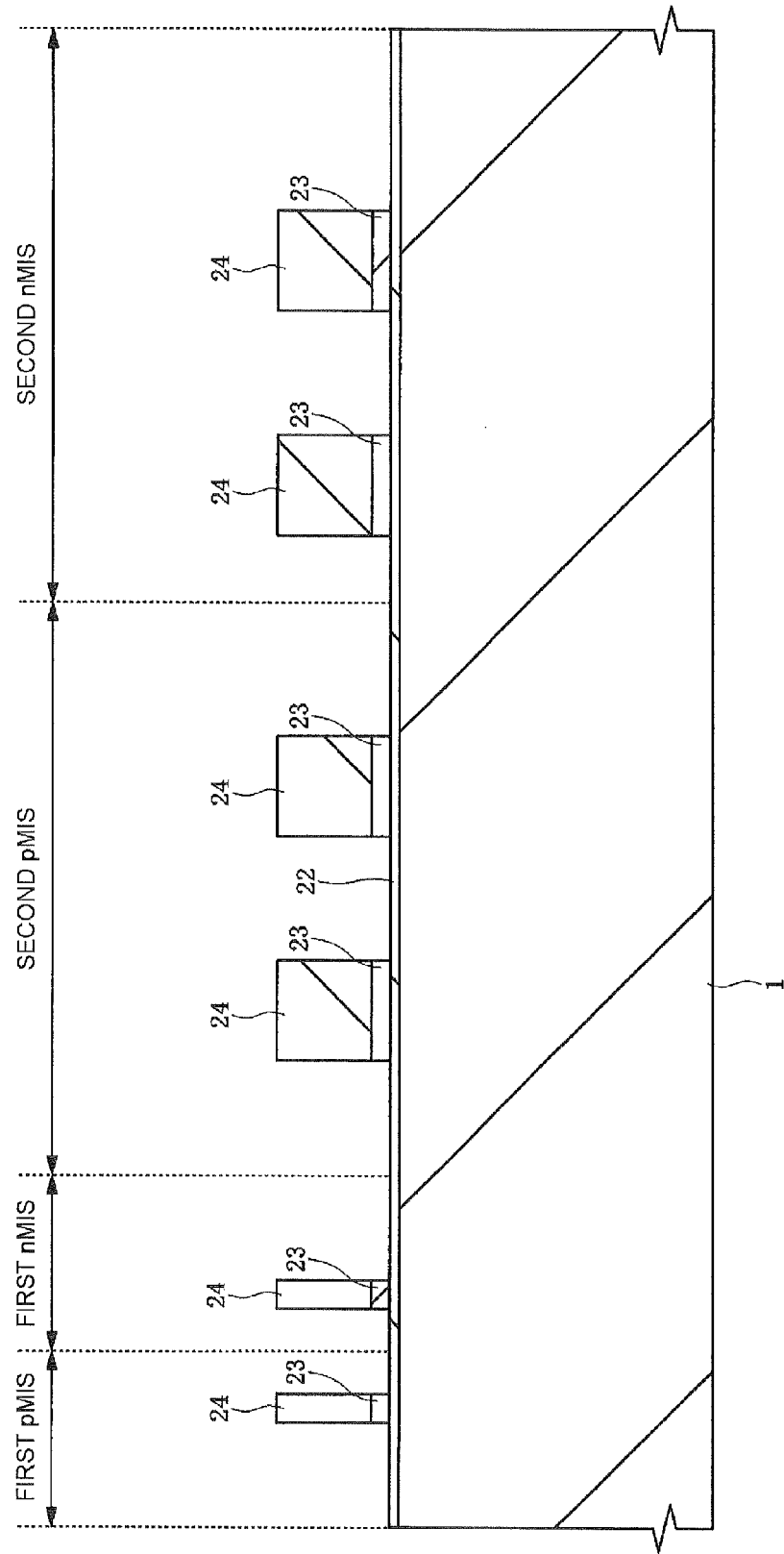
FIG. 7 is a main part sectional view of a same point as in FIG. 6 during a manufacturing step of the semiconductor device subsequent to FIG. 6.

Next, as shown in FIG. 7, the $Si_3N_4$ film 23 exposed from the resist pattern 24 is removed by using the resist pattern 24 as a mask, for example, using a dry etching method.

Figure 8:
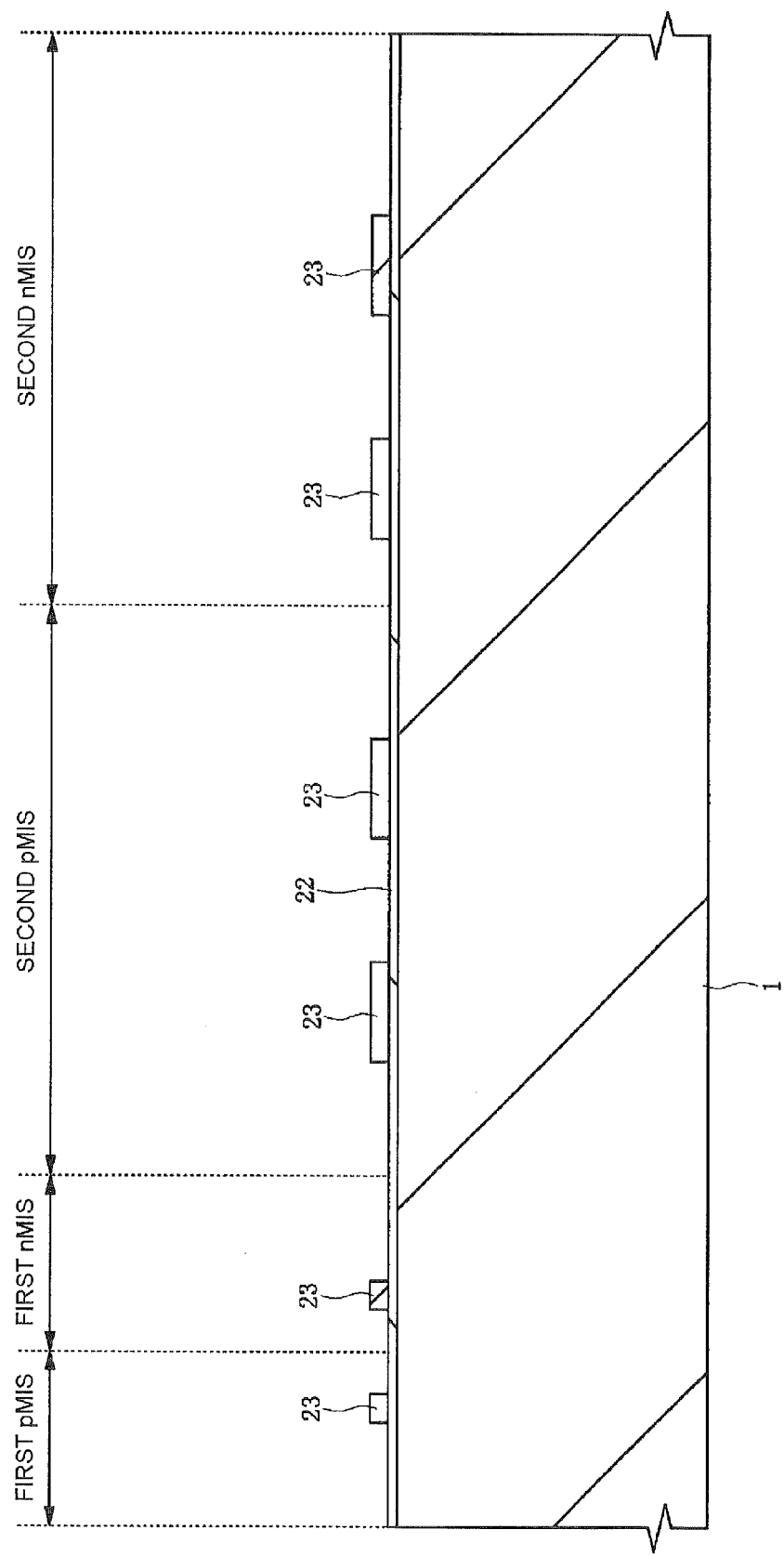
FIG. 8 is a main part sectional view of the same point as in FIG. 6 during a manufacturing step of the semiconductor device subsequent to FIG. 7.

Subsequently, the resist pattern 24 is removed as shown in FIG. 8.

Figure 9:
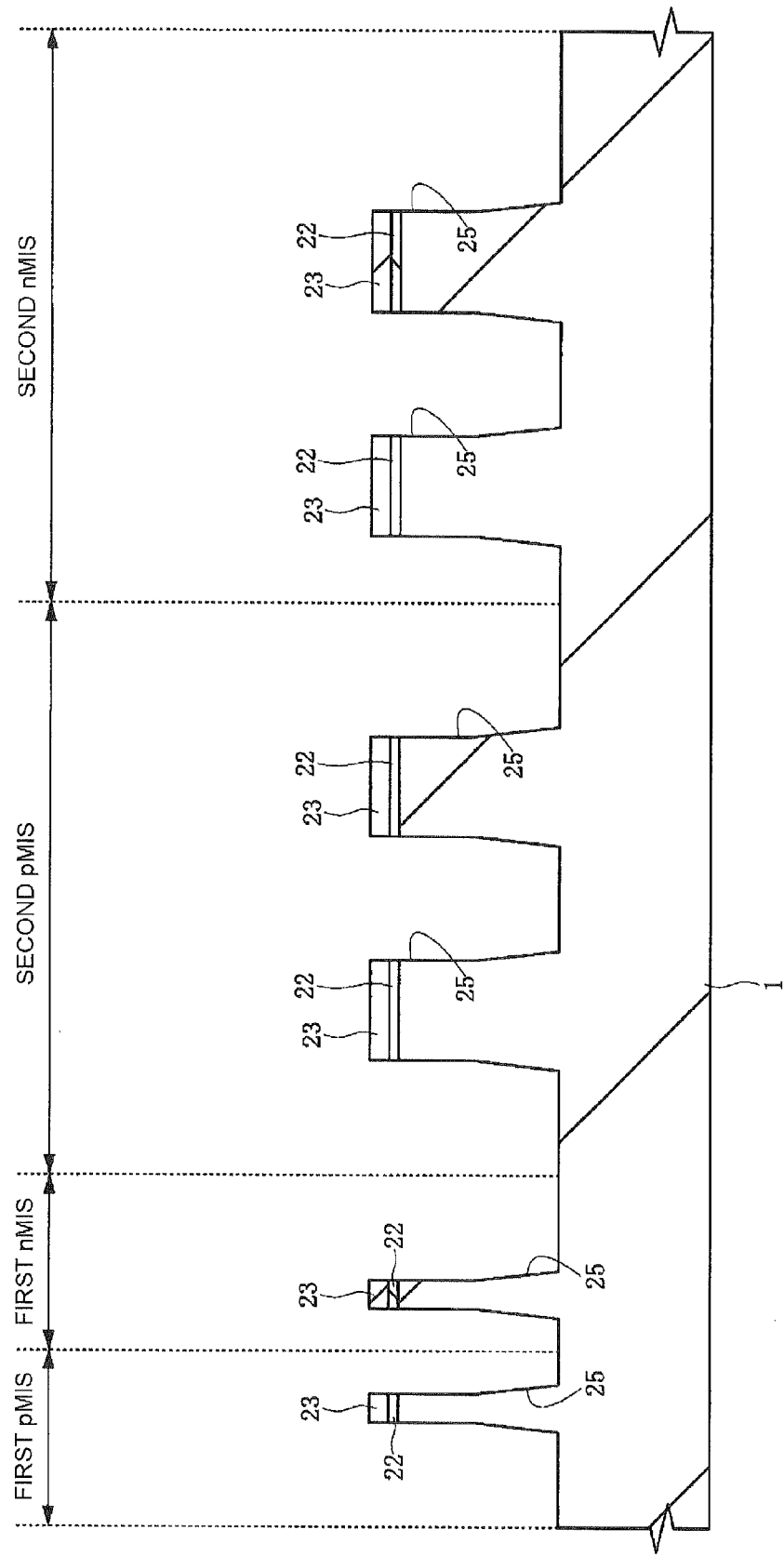
FIG. 9 is a main part sectional view of the same point as in FIG. 6 during a manufacturing step of the semiconductor device subsequent to FIG. 8.

Next, as shown in FIG. 9, the $SiO_2$ film 22 and the semiconductor substrate 1 that are exposed from the $Si_3N_4$ film 23 are sequentially removed by using the $Si_3N_4$ film 23 as a mask, for example, using the dry etching method, and a plurality of trenches 25 is formed in the semiconductor substrate 1. As a result, the trench 25 is formed in the element isolation region. In addition, simultaneously, one or more trenches 25 extending in the gate length direction of the second nMIS are formed in the gate width direction in the second nMIS region, and one or more trenches 25 extending in the gate length direction of the second pMIS are formed in the gate width direction in the second pMIS region.

A depth of the trench 25 is set in consideration of a height of the first convex portion formed in the first nMIS region and the first pMIS region, respective well designs and channel designs of the second nMIS and the second pMIS, an eventual thickness of the element isolation portion, and the other respective factors, and it is, for example, approximately 300 nm. In addition, a width of the $Si_3N_4$ film 23 in the gate width direction of the first nMIS and the first pMIS is, for example, approximately 30 nm. Moreover, a width of the $Si_3N_4$ film 23 and a width of the trench 25 in the gate width direction of the second nMIS and the second pMIS are, for example, approximately 100 nm.

Figure 10:
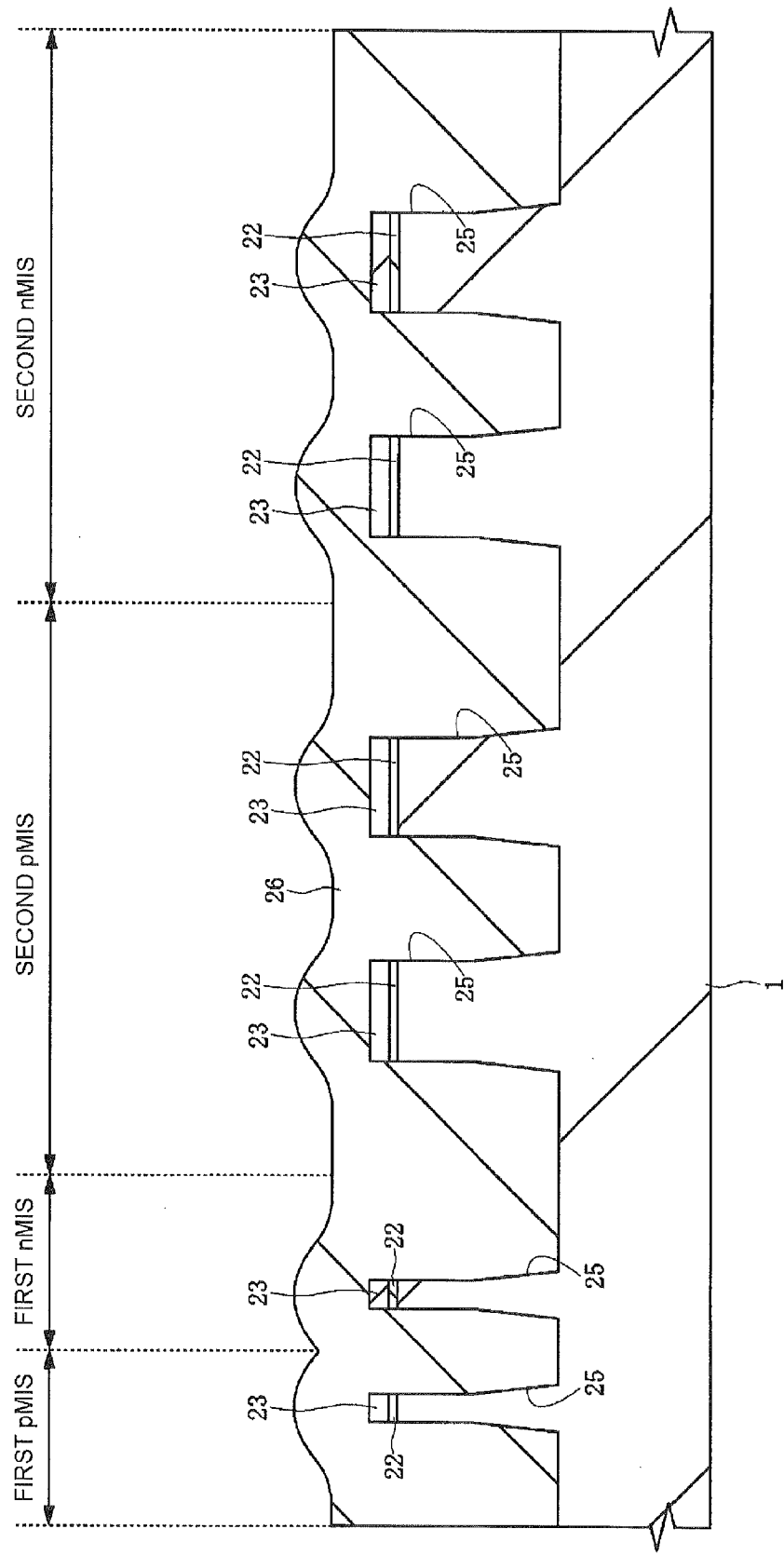
FIG. 10 is a main part sectional view of the same point as in FIG. 6 during a manufacturing step of the semiconductor device subsequent to FIG. 9.

Next, as shown in FIG. 10, the trench 25 is buried over the main surface of the semiconductor substrate 1 to form an oxide film 26. This oxide film 26 is, for example, an HARP oxide film that is formed using a plasma CVD (Chemical Vapor Deposition) method using TEOS (Tetra Ethyl Ortho Silicate; $Si(OC_2H_5)_4$) and ozone ($O_3$) as a source gas, an HDP oxide film that is formed using a high density plasma CVD method, or a polysilazane oxide film, etc. Subsequently, heat treatment for baking is performed. This heat treatment is carried out at 1100° C., for example.

Figure 11:
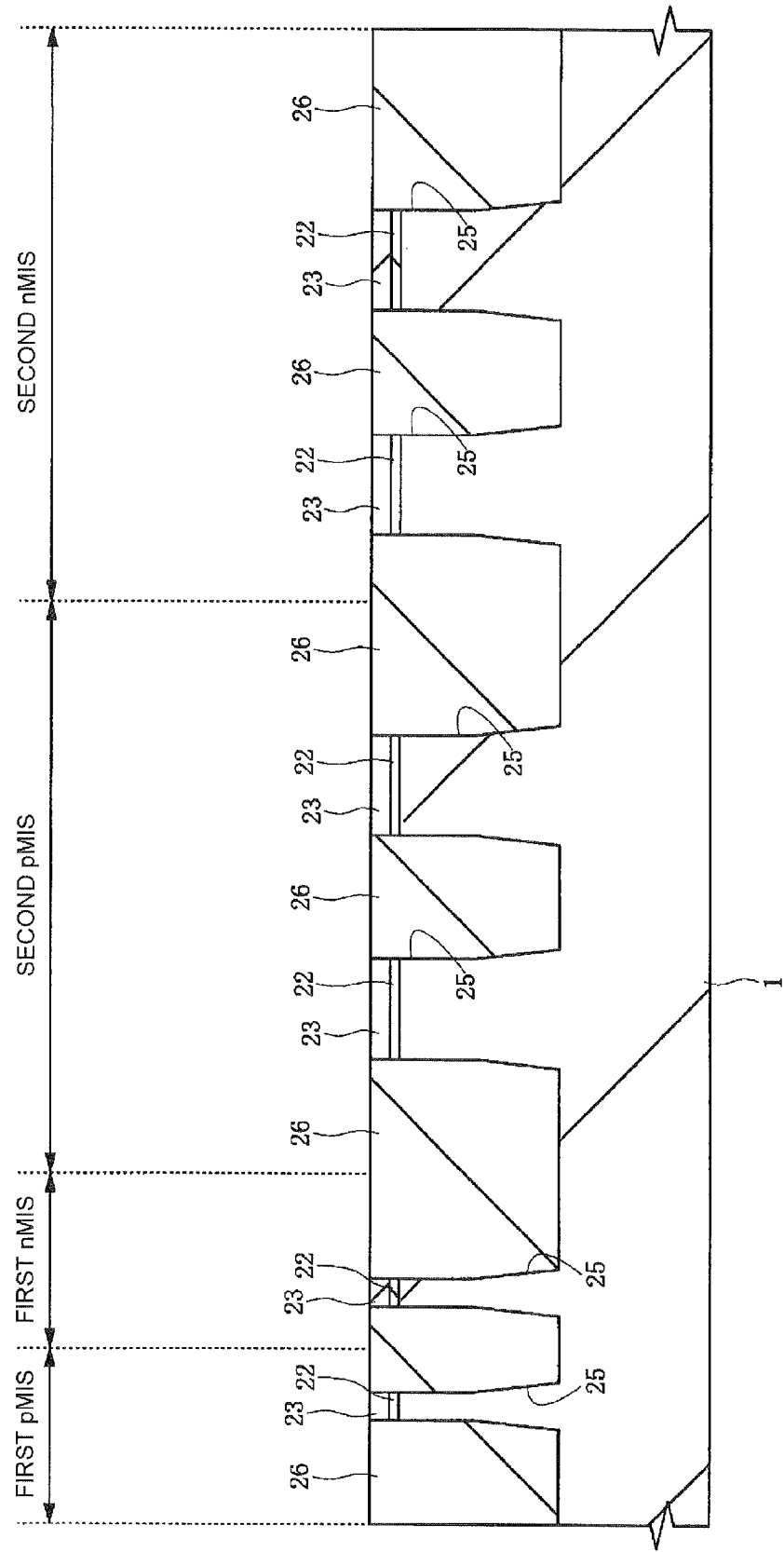
FIG. 11 is a main part sectional view of the same point as in FIG. 6 during a manufacturing step of the semiconductor device subsequent to FIG. 10.

Subsequently, as shown in FIG. 11, a surface of the oxide film 26 is polished, for example, using a CMP (Chemical Mechanical Polish) method until a top surface of the $Si_3N_4$ film 23 is exposed.

Figure 12:
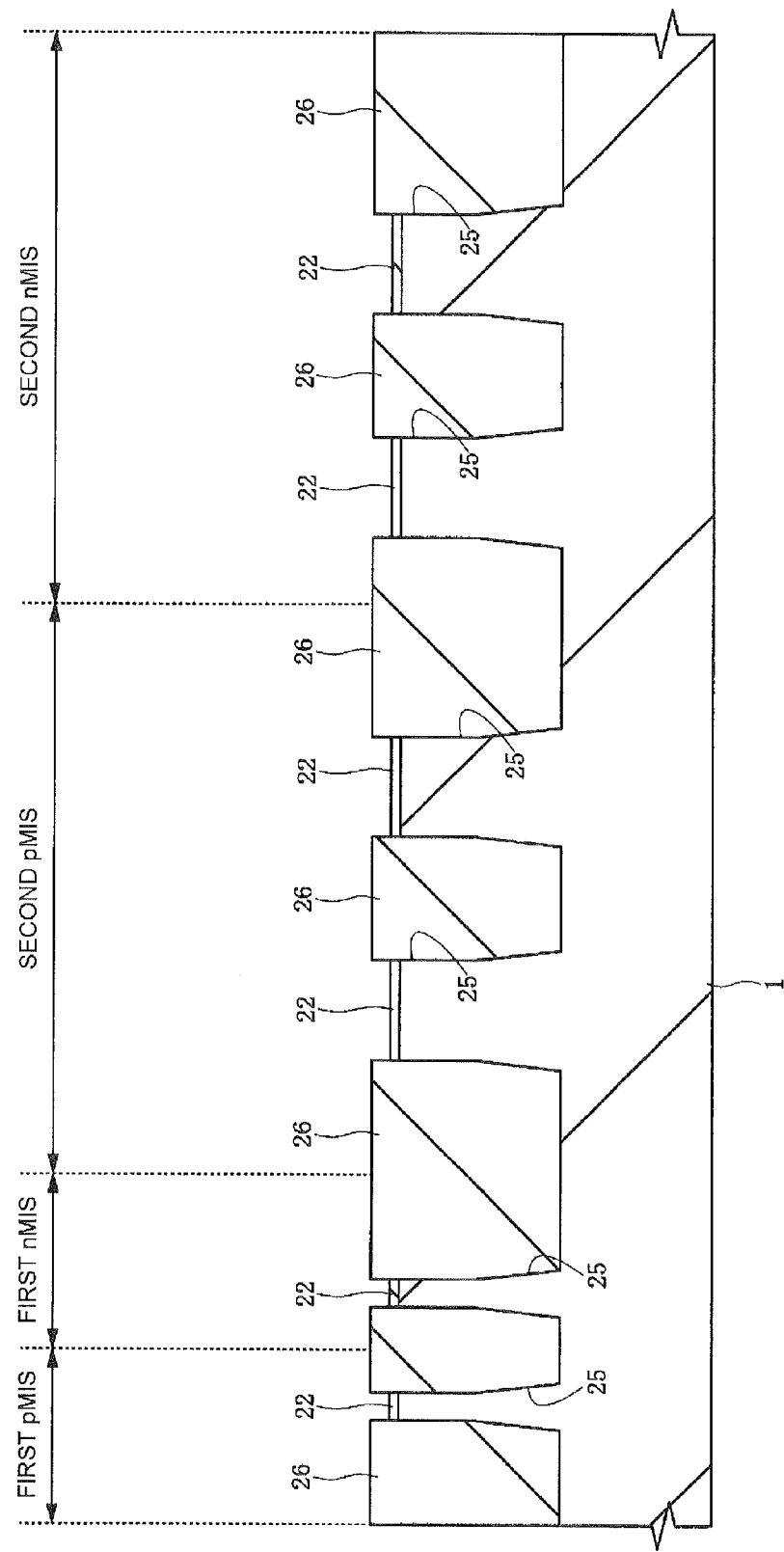
FIG. 12 is a main part sectional view of the same point as in FIG. 6 during a manufacturing step of the semiconductor device subsequent to FIG. 11.

Next, as shown in FIG. 12, the $Si_3N_4$ film 23 is removed using hot phosphorus solution.

Figure 13:
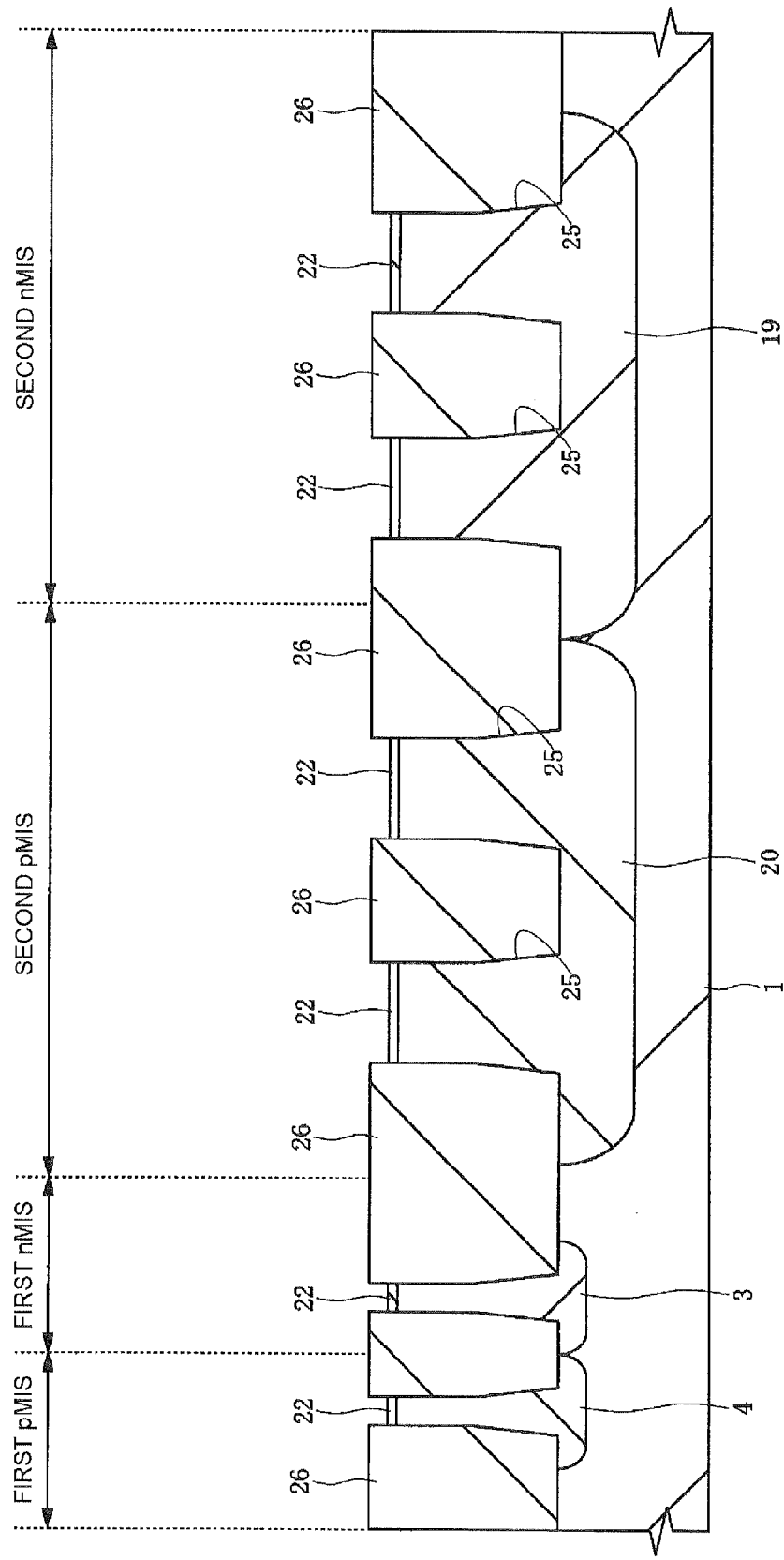
FIG. 13 is a main part sectional view of the same point as in FIG. 6 during a manufacturing step of the semiconductor device subsequent to FIG. 12.

Subsequently, as shown in FIG. 13, the p-type impurity is selectively introduced into the semiconductor substrate 1 of the first nMIS region using anion implantation method, to form the p-type well 3. In this case, the p-type well 3 is formed so that an impurity concentration on the main surface side of the semiconductor substrate 1 is high. Similarly, the n-type impurity is selectively introduced into the semiconductor substrate 1 of the first pMIS region using the ion implantation method, to form the n-type well 4. In this case, the n-type well 4 is formed so that an impurity concentration on the main surface side of the semiconductor substrate 1 is high.

Subsequently, the p-type impurity is selectively introduced into the semiconductor substrate 1 of the second nMIS region using the ion implantation method, to form the p-type well 19. In this case, the p-type well 19 is formed so that an impurity concentration is substantially uniform. Similarly, the n-type impurity is selectively introduced into the semiconductor substrate 1 of the second pMIS region using the ion implantation method, to form the n-type well 20. In this case, the n-type well 20 is formed so that an impurity concentration is substantially uniform. In addition, depths of the p-type well 19 and the n-type well 20 from the main surface of the semiconductor substrate 1 are formed deeper than depths of the p-type well 3 and the n-type well 4 from the main surface of the semiconductor substrate 1. After that, heat treatment is performed as necessary.

Figure 14:
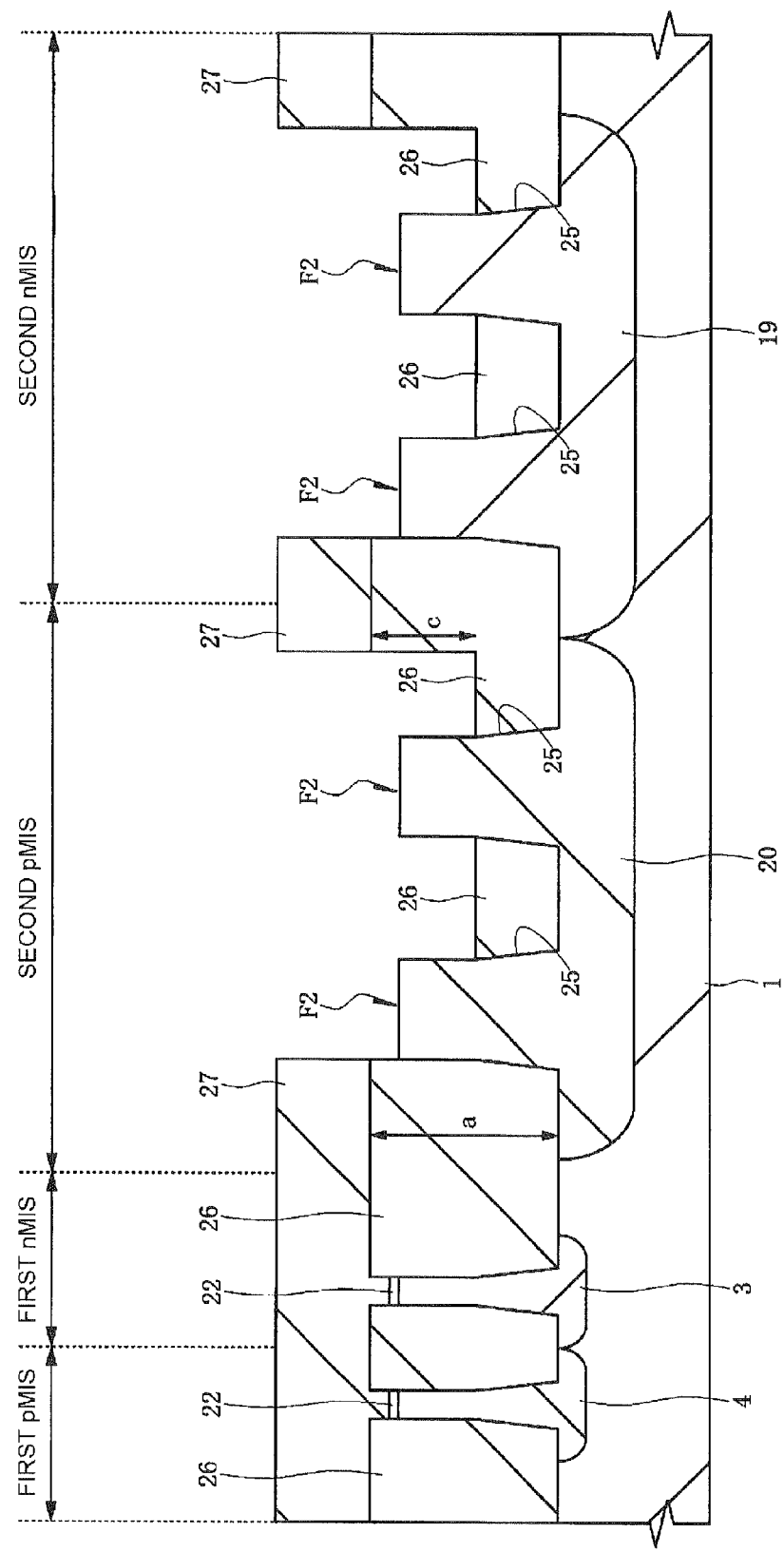
FIG. 14 is a main part sectional view of the same point as in FIG. 6 during a manufacturing step of the semiconductor device subsequent to FIG. 13.

It is to be noted that although here, the p-type well 19 and the n-type well 20 are formed after the p-type well 3 and the n-type well 4 were formed, the p-type well 3 and the n-type well 4 may be formed after the p-type well 19 and the n-type well 20 are formed, Next, as shown in FIG. 14, the first nMIS region and the first pMIS region are covered with a resist pattern 27, and the oxide film 26 is etched until a thickness of the oxide film 26 in the trench 25 of the second nMIS region and the second pMIS region reaches a predetermined one using a dry etching method, a wet etching method using hydrofluoric acid solution, or an appropriate combination of the methods. A thickness (c) of the oxide film 26 to be etched corresponds to a value (c=a−b) obtained by subtracting from an original thickness (a) of the oxide film 26 a height (a height b shown in FIG. 16 that will be mentioned hereinafter) of the first convex portion formed in the first nMIS region and the first pMIS region in a subsequent step. Namely, at a bottom portion of the trench 25 of the second nMIS region and the second pMIS region, the oxide film 26 having a thickness substantially equal to the height of the first convex portion formed in the subsequent step remains. If the original thickness of the oxide film 26 is, for example, approximately 350 nm (a), the oxide film 26 is etched by approximately 200 nm (c), and the oxide film 26 having a thickness of approximately 150 nm remains at the bottom portion of the trench 25 of the second nMIS region and the second pMIS region.

Figure 15:
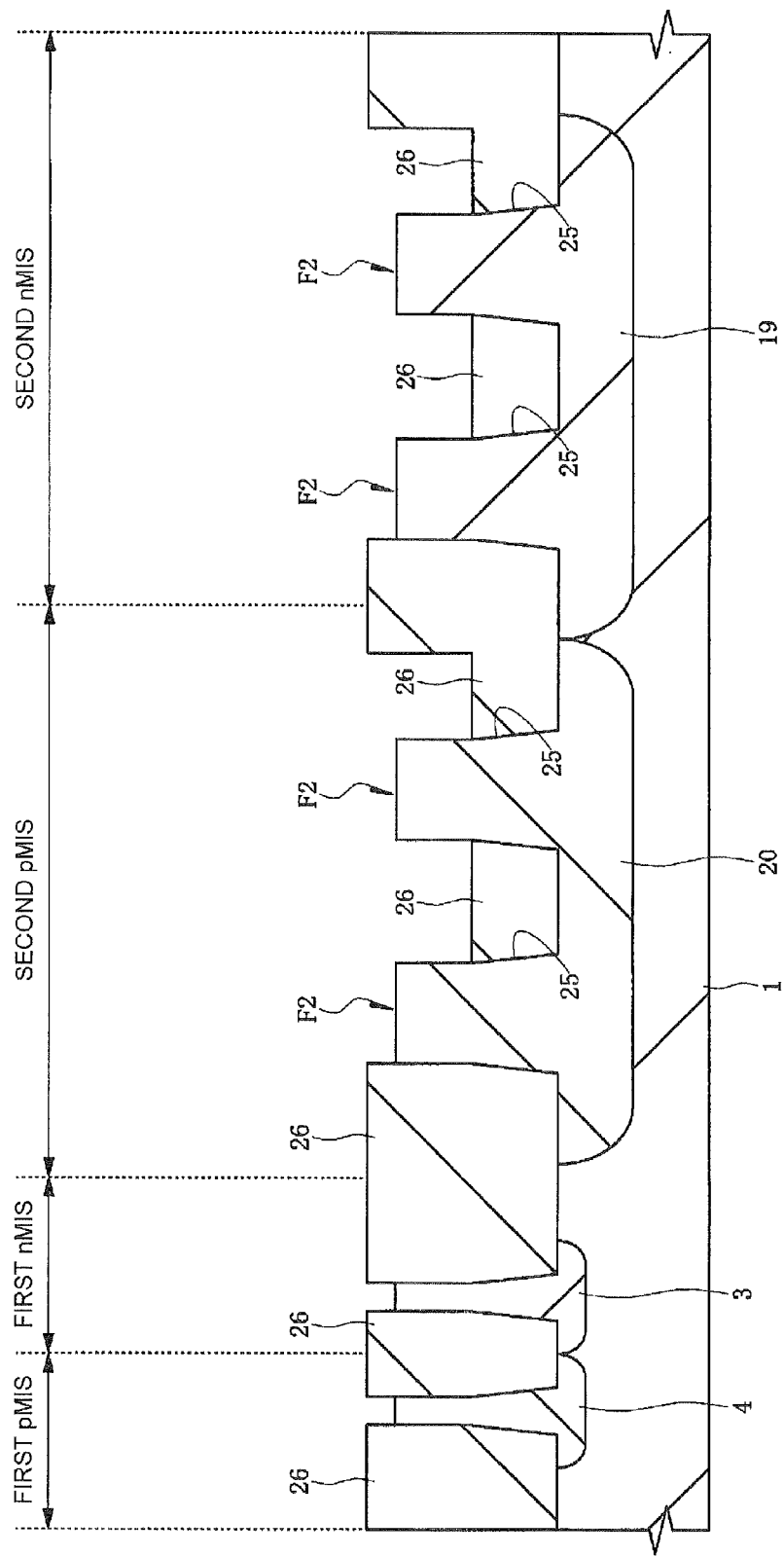
FIG. 15 is a main part sectional view of the same point as in FIG. 6 during a manufacturing step of the semiconductor device subsequent to FIG. 14.

Subsequently, the resist pattern 27 is removed as shown in FIG. 15.

Figure 16:
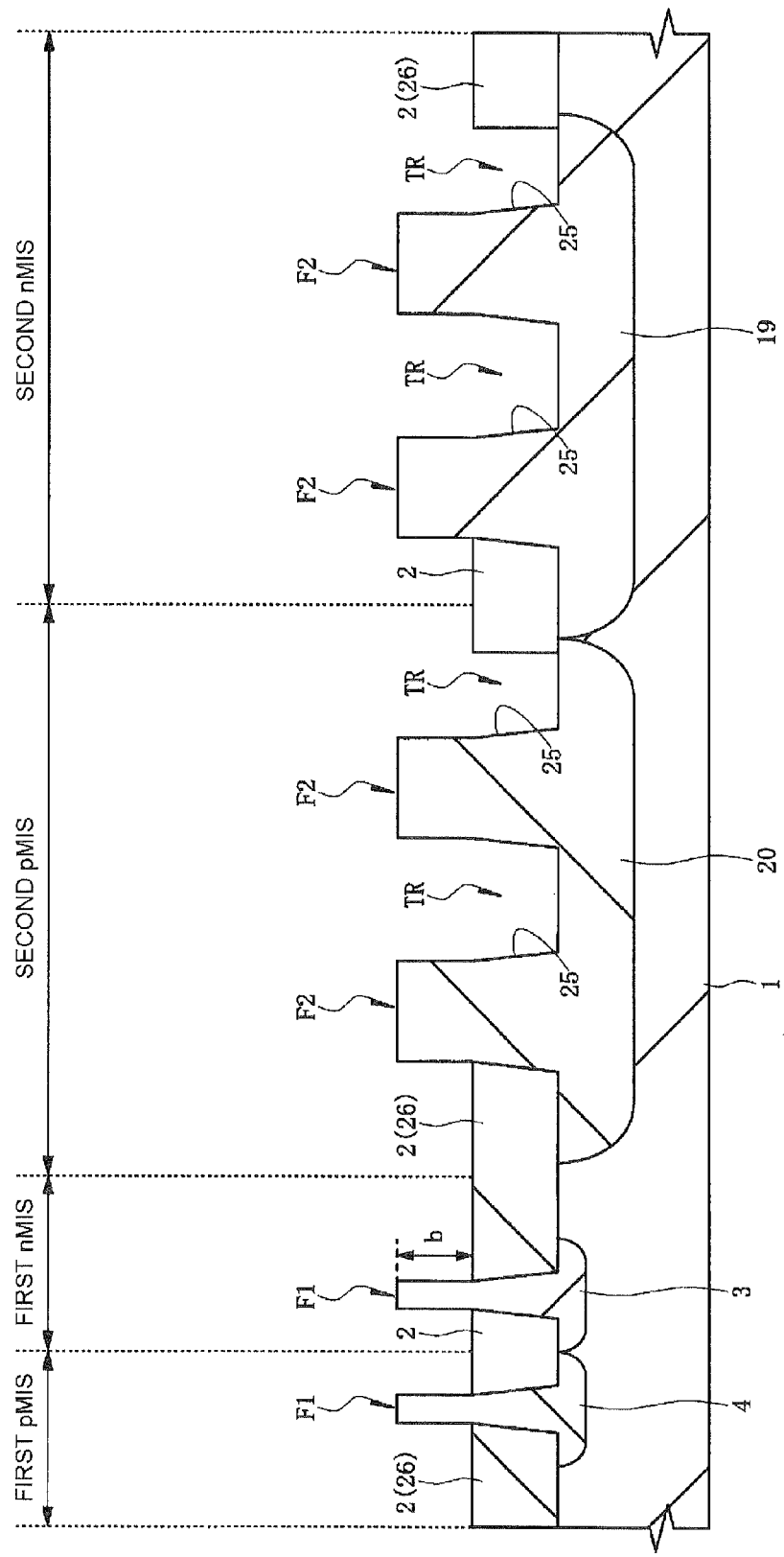
FIG. 16 is a main part sectional view of the same point as in FIG. 6 during a manufacturing step of the semiconductor device subsequent to FIG. 15.

Next, as shown in FIG. 16, the oxide film 26 is etched until the oxide film 26 in the trench 25 of the second nMIS region and the second pMIS is entirely removed using the wet etching method using hydrofluoric acid solution, the dry etching method, or an appropriate combination of the methods. Since it is necessary here to completely remove the oxide film 26 in the trench 25, the wet etching method or an isotropic etching method is preferably used. As a result, in the second nMIS region and the second pMIS region, the second convex portion F2 and the trench portion TR that form respective channels of the second nMIS and the second pMIS are alternately formed in the gate width direction.

Simultaneously, the first convex portion F1 that forms respective channels of the first nMIS and the first pMIS over the oxide film 26 projects in the first nMIS region and the first pMIS region. For example, as explained using the above-mentioned FIG. 14, when the original thickness of the oxide film 26 is approximately 350 nm (a), and the oxide film 26 is etched by approximately 200 nm (c), the height (b) of the first convex portion F1 is approximately 150 nm.

It is to be noted that in the above-mentioned convex portion and trench portion forming step, the oxide film 26 of the second nMIS region and the second pMIS region is once etched to allow the oxide film 26 of the predetermined thickness (height of the first convex portion F1) to remain at the bottom portion of the trench 25 and subsequently, a whole area of the oxide film 26 is etched to form the first convex portion F1 in the first nMIS region and the first pMIS region, respectively, and to form the second convex portion F2 and the trench portion TR in the second nMIS region and the second pMIS region, respectively, but the present invention is not limited to this. For example, the whole area of the oxide film 26 is once etched back to form the first convex portion F1 in the first nMIS region and the first pMIS region, respectively, and to form the second convex portion F2 in the second nMIS region and the second pMIS region, respectively, and subsequently, the oxide film 26 in the trench 25 of the second nMIS region and the second pMIS region may be removed to form the trench portion TR. However, since in the latter case, coating and removal of the resist are performed in a state where single crystal Si constituting the first convex portion F1 and the second convex portion F2 is exposed, there is a possibility that transistor characteristics of the first nMIS and the first pMIS deteriorate. Accordingly, if priority is given to the transistor characteristics of the first nMIS and the first pMIS, the former case is preferable.

<Gate Insulating Film Forming Step>

Figure 17:
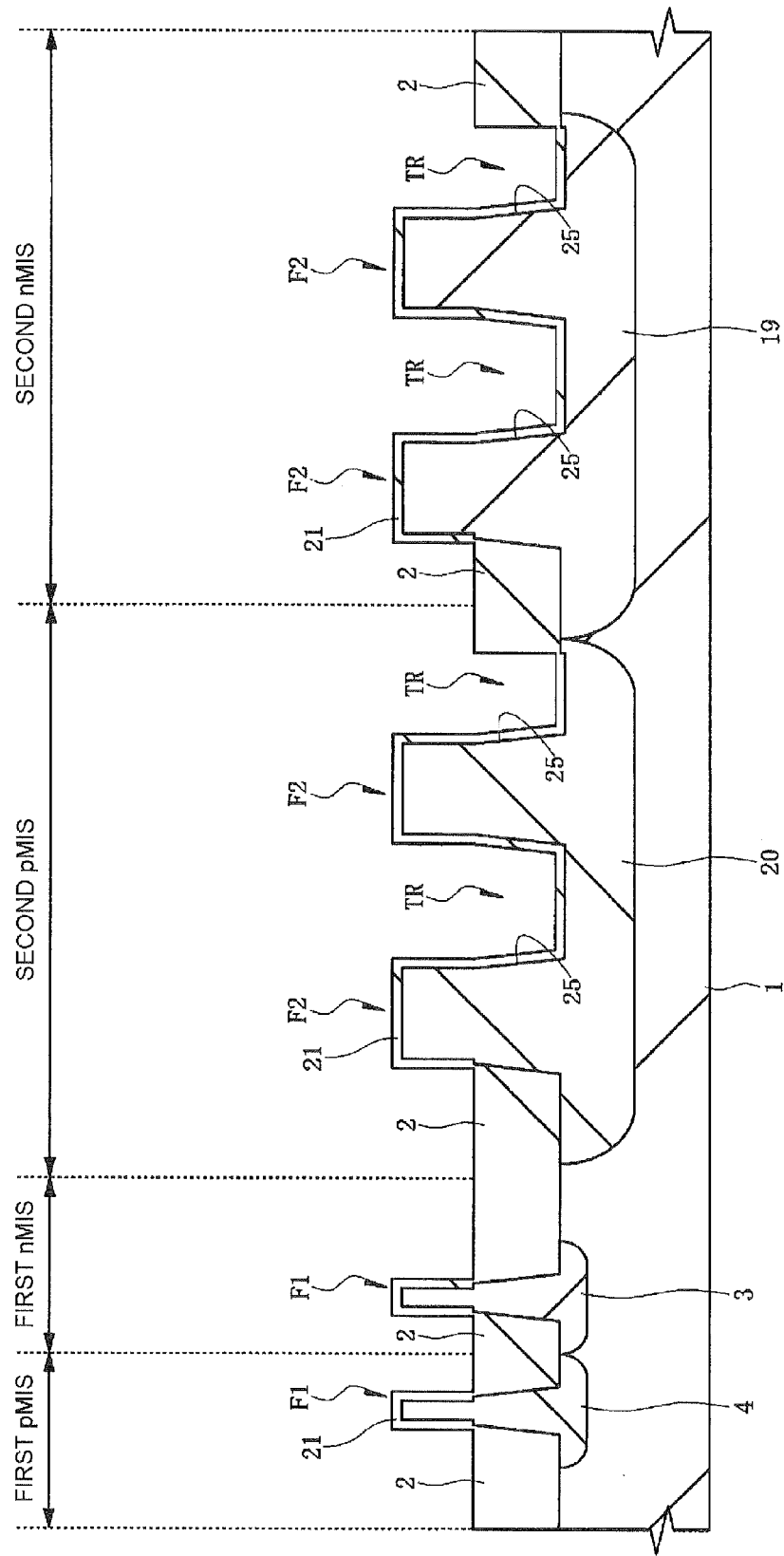
FIG. 17 is a main part sectional view of the same point as in FIG. 6 during a manufacturing step of the semiconductor device subsequent to FIG. 16.

Next, as shown in FIG. 17, the gate insulating film 21 having a thickness of approximately 10 to 20 nm that includes an oxide film is formed on the exposed main surface of the semiconductor substrate 1, for example, using a thermal oxidation method.

Figure 18:
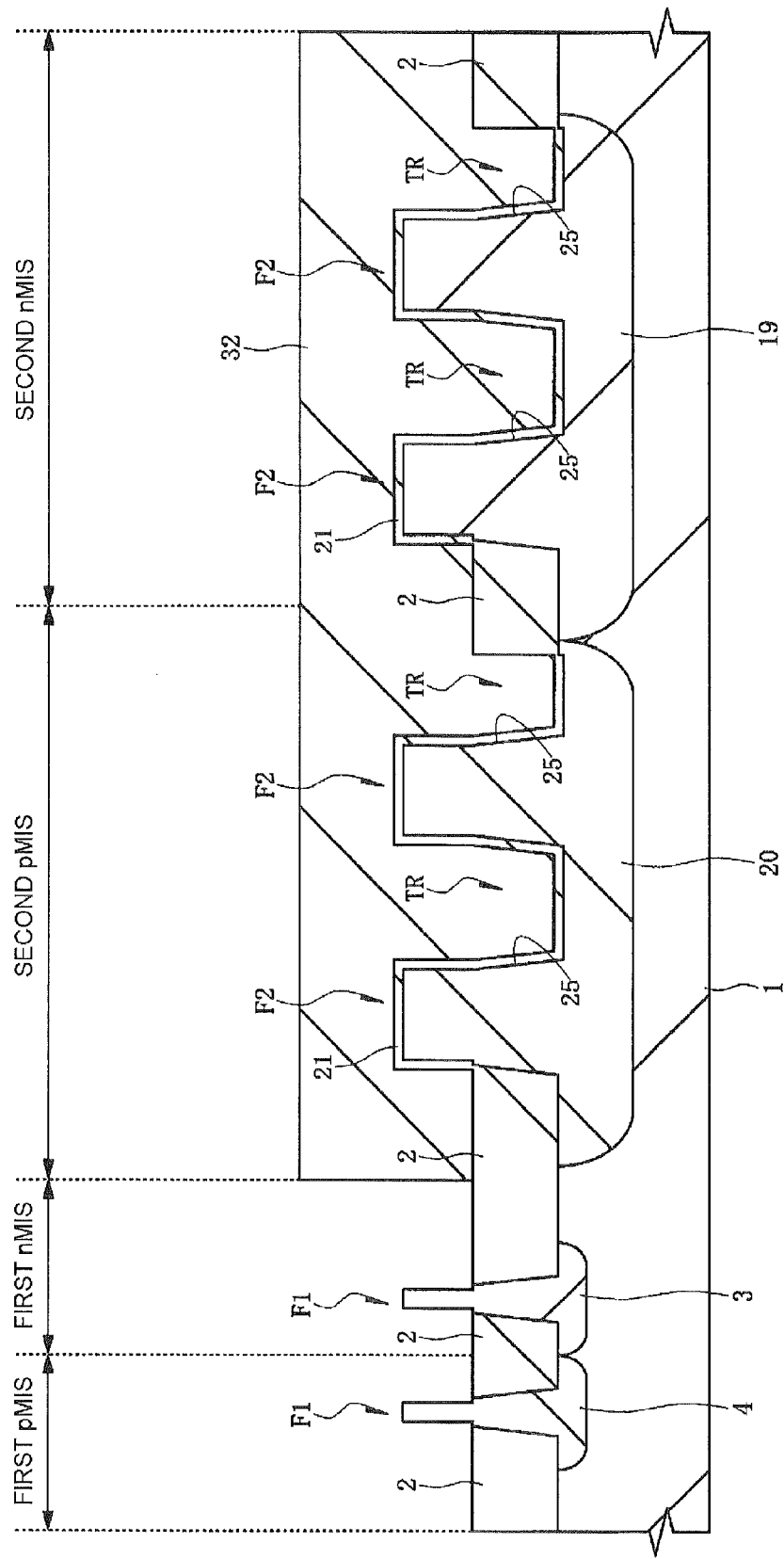
FIG. 18 is a main part sectional view of the same point as in FIG. 6 during a manufacturing step of the semiconductor device subsequent to FIG. 17.

Subsequently, as shown in FIG. 18, the second nMIS region and the second pMIS region are covered with a resist pattern 32, and the gate insulating film 21 of the first nMIS region and the first pMIS region is removed by the wet etching method using hydrofluoric acid solution.

Figure 19:
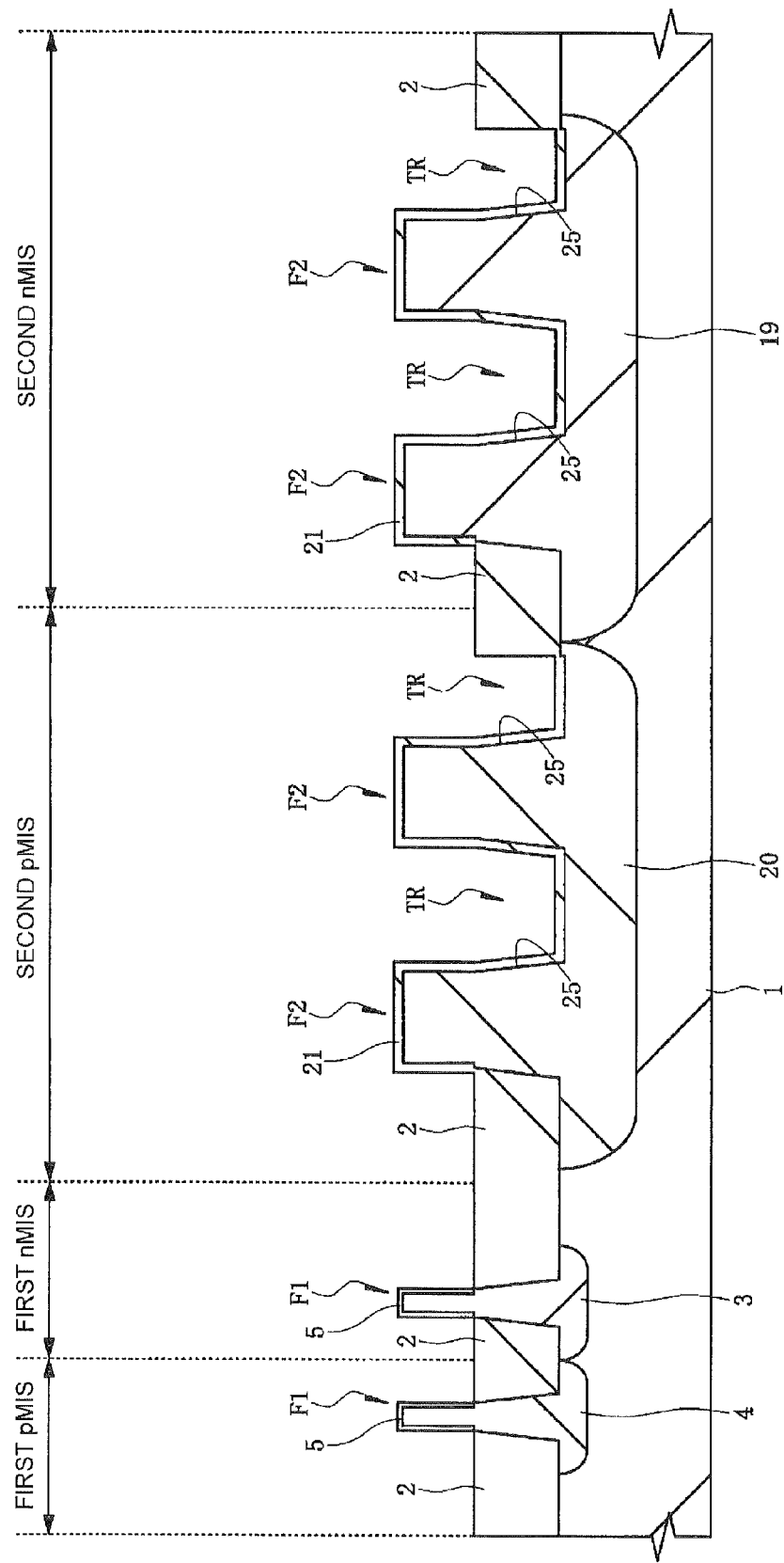
FIG. 19 is a main part sectional view of the same point as in FIG. 6 during a manufacturing step of the semiconductor device subsequent to FIG. 18.

Next, as shown in FIG. 19, after the resist pattern 32 is removed, the gate insulating film 5 having a thickness of approximately 2 to 3 nm that includes an oxide film is formed on the exposed main surface of the semiconductor substrate 1 of the first nMIS region and the first pMIS region, for example, using the thermal oxidation method. Although in this case, the gate insulating film 21 of the second nMIS region and the second pMIS region is also oxidized, an increment of the film thickness of the gate insulating film 21 is smaller and fewer than the film thickness of the gate insulating film 5.

As a result, the gate insulating film 5 is formed on the surfaces of the respective first convex portions F1 of the first nMIS region and the first pMIS region, and the gate insulating film 21 is formed on the surfaces of the respective second convex portions F2 and the trench portions TR of the second nMIS region and the second pMIS region.

In the first embodiment, the thickness of the gate insulating film 5 of the first nMIS and the first pMIS is set as one type, and the thickness of the gate insulating film 21 of the second nMIS and the second pMIS is set as one type, but the present invention is not limited to this. For example, the thickness of the gate insulating film 21 of the second nMIS and the second pMIS may be set as two types, and the present invention may also be a combination of types other than this.

<Gate Electrode Forming Step>

Figure 20:
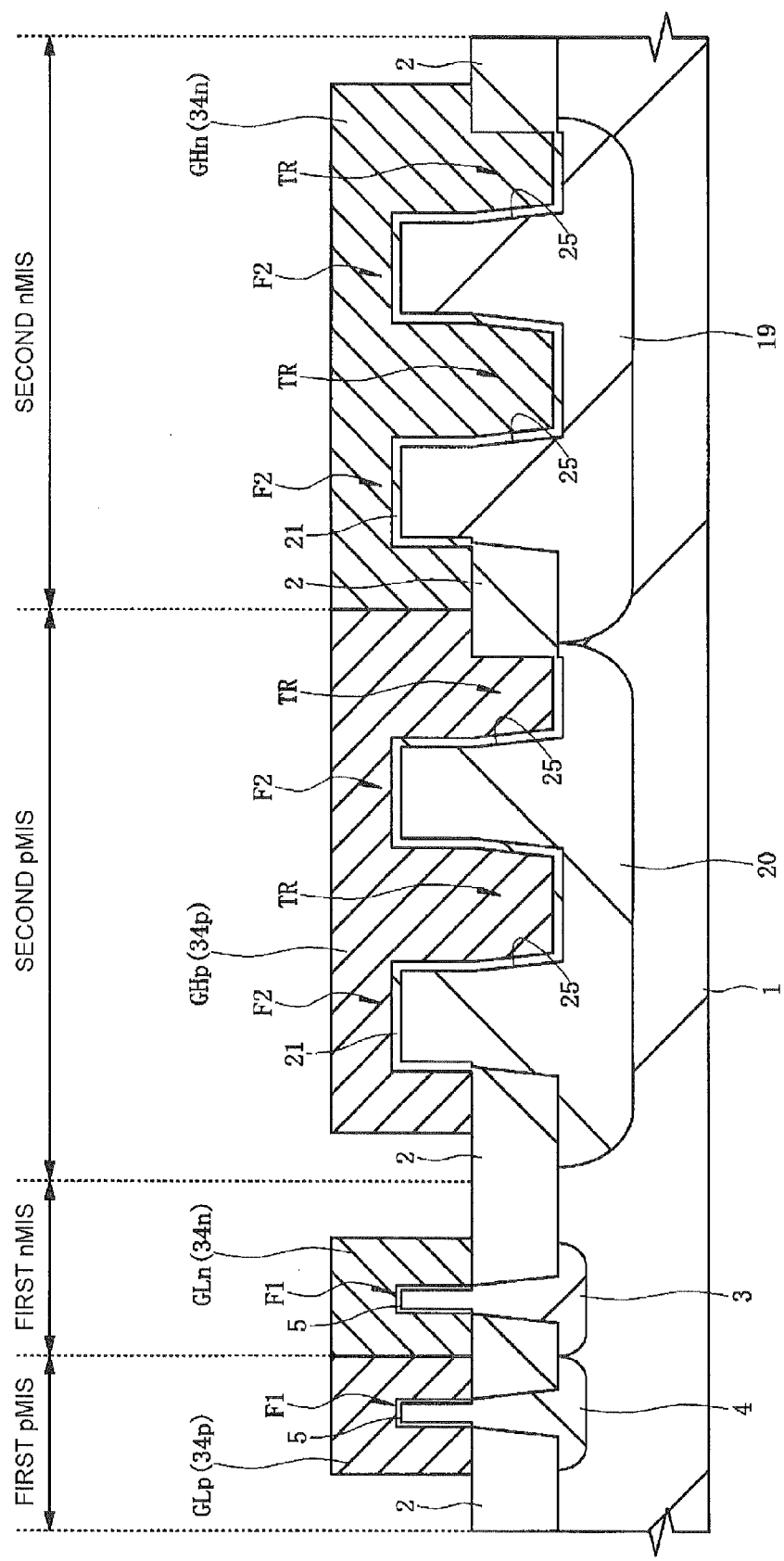
FIG. 20 is a main part sectional view of the same point as in FIG. 6 during a manufacturing step of the semiconductor device subsequent to FIG. 19.

Next, as shown in FIG. 20, for example, a conductive film (not shown) including amorphous Si is deposited over the main surface of the semiconductor substrate 1 by the CVD method. Subsequently, the n-type impurity is introduced into the conductive film of the first nMIS region and the second nMIS region by the ion implantation method, etc., to form an n-type conductive film 34n. In addition, the p-type impurity is introduced into the conductive film of the first pMIS region and the second pMIS region by the ion implantation method, etc., to form a p-type conductive film 34p.

Subsequently, the conductive films 34n and 34p exposed from a resist pattern are removed by using the resist pattern as a mask, for example, using the dry etching method, and formed are the gate electrode GLn of the first nMIS that includes the conductive film 34n, the gate electrode GLp of the first pMIS that includes the conductive film 34p, the gate electrode GHn of the second nMIS that includes the conductive film 34n, and the gate electrode GHp of the second pMIS that includes the conductive film 34p. Here, gate widths of the gate electrode GHn of the second nMIS and the gate electrode GHp of the second pMIS are formed larger than gate widths of the gate electrode GLn of the first nMIS and the gate electrode GLp of the first pMIS.

As a result, the gate electrode GLn and the gate electrode GLp are formed through the gate insulating film 5 on the top surface and the two opposing side surfaces of the respective first convex portions F1 of the first nMIS region and the first pMIS region, and the gate electrode GHn and the gate electrode GHp are formed through the gate insulating film 21 on the top surface and the two opposing side surfaces of the respective second convex portions F2 and the bottom surfaces and the two opposing side surfaces of the respective trench portions TR of the second nMIS region and the second pMIS region.

<Offset Sidewall Forming Step>

Figure 21:
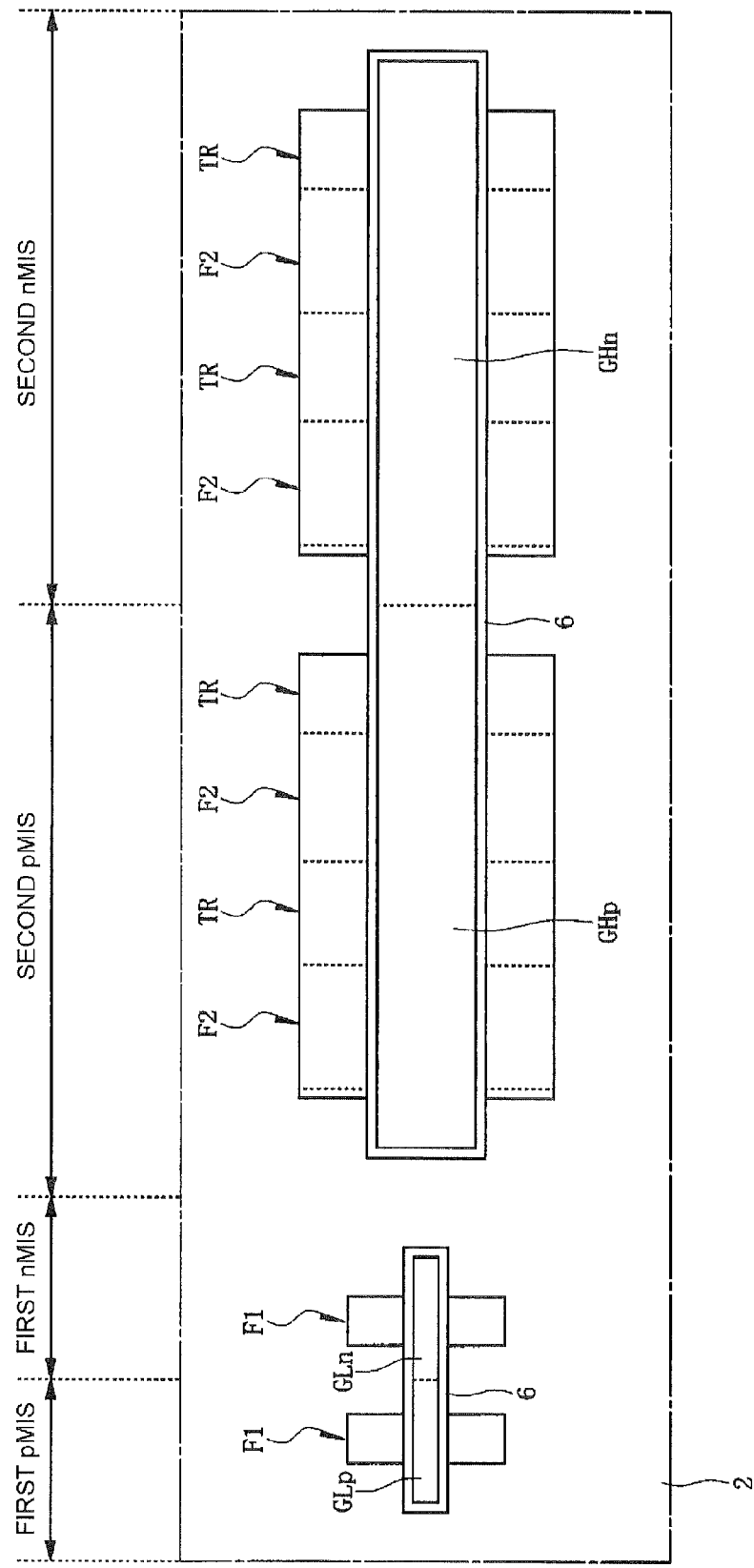
FIG. 21 is a main part plan view of a semiconductor substrate during a manufacturing step of the semiconductor device subsequent to FIG. 20.

Next, as shown in FIG. 21, the offset sidewall 6 is formed on the side surfaces of the gate electrode GLn of the first nMIS, the gate electrode GLp of the first pMIS, the gate electrode GHn of the second nMIS, and the gate electrode GHp of the second pMIS.

<Epitaxial Silicon Layer Forming Step>

Figure 22:
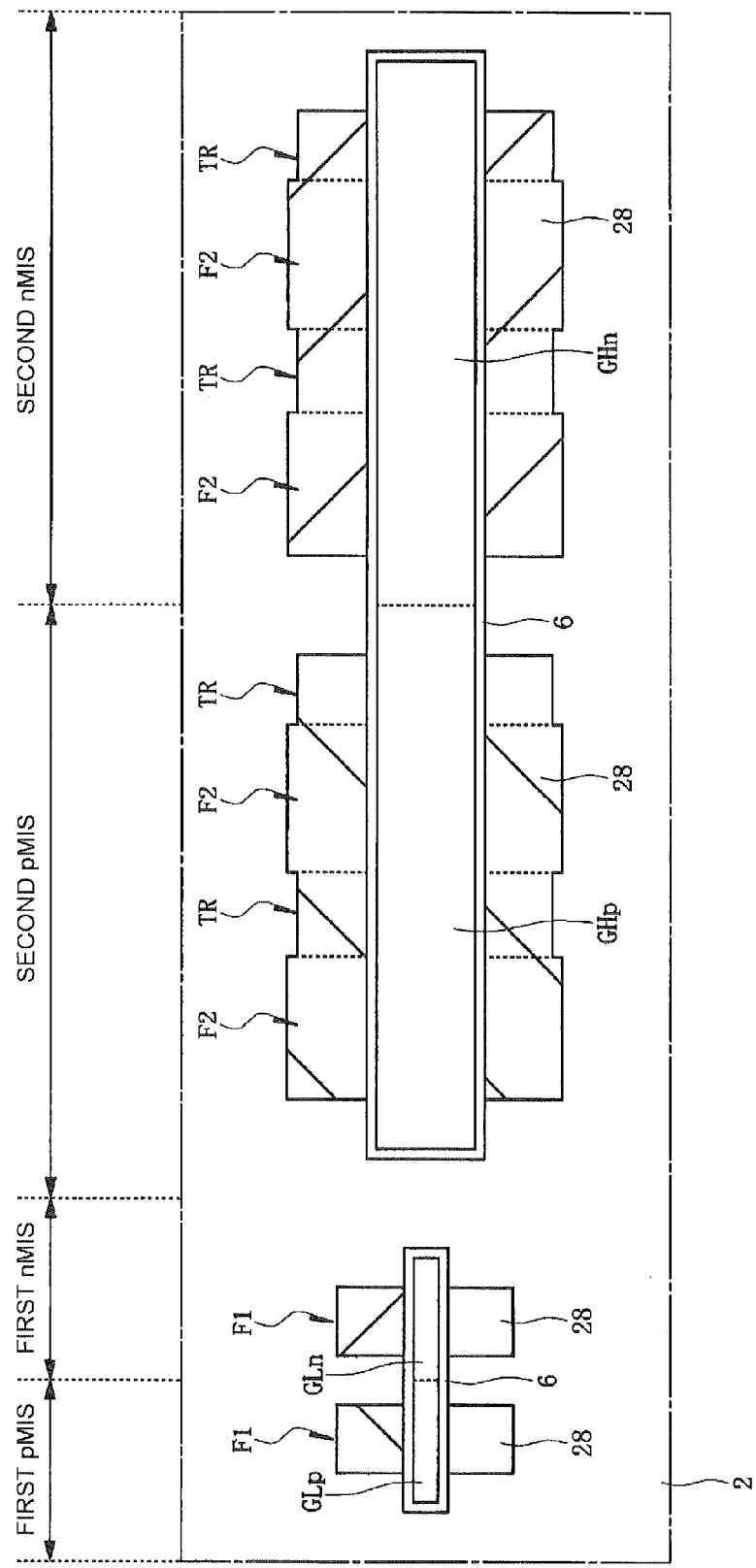
FIG. 22 is a main part plan view of a same point as in FIG. 21 during a manufacturing step of the semiconductor device subsequent to FIG. 21.

Subsequently, as shown in FIG. 22, an epitaxial silicon layer 28 is formed on the surface of the semiconductor substrate 1 constituting the exposed first convex portions F1 of the first nMIS and the first pMIS by an epitaxial growth method. This increases an area in the top view of the first convex portion F1 in which a source/drain is formed. In this case, similarly, the epitaxial silicon layer 28 is formed also on the surface of the semiconductor substrate 1 constituting the exposed second convex portion F2 and the trench portion TR of the second nMIS and the second pMIS.

<Halo Diffusion Layer Forming Step>

Figure 23:
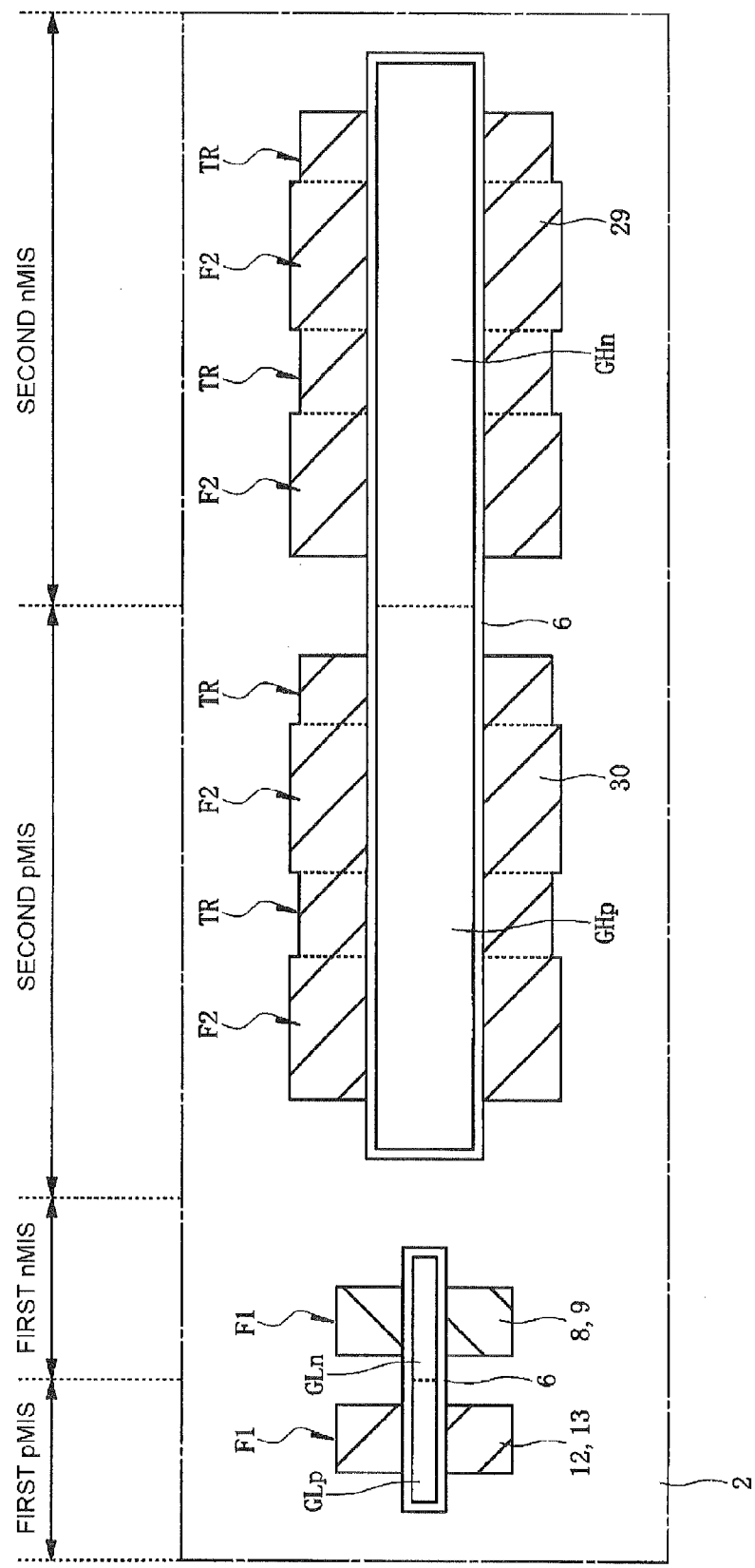
FIG. 23 is a main part plan view of the same point as in FIG. 21 during a manufacturing step of the semiconductor device subsequent to FIG. 22.

Next, as shown in FIG. 23, the p-type impurity is ion-implanted on the surface of the first convex portion F1 of the first nMIS region, to form the p-type halo diffusion layer 9 in a self-aligned manner with respect to the gate electrode GLn of the first nMIS. Similarly, the n-type impurity is ion-implanted on the surface of the first convex portion F1 of the first pMIS region, to form an n-type halo diffusion layer 13 in the self-aligned manner with respect to the gate electrode GLp of the first pMIS.

<Diffusion Layer Forming Step>

Subsequently, the n-type impurity is ion-implanted on the surface of the first convex portion F1 of the first nMIS region, to form the first n-type diffusion layer 8 in the self aligned manner with respect to the gate electrode GLn of the first nMIS. Similarly, the p-type impurity is ion-implanted on the surface of the first convex portion F1 of the first pMIS region, to form a p-type diffusion layer in the self-aligned manner with respect to the gate electrode GLp of the first pMIS.

Subsequently, the n-type impurity is ion-implanted on the surfaces of the second convex portion F2 and the trench TR of the second nMIS region, to form the first n-type diffusion layer 29 in the self-aligned manner with respect to the gate electrode GHn of the second nMIS region. Similarly, the p-type impurity is ion-implanted on the surfaces of the second convex portion F2 and the trench TR of the second pMIS region, to form a first p-type diffusion layer 30 in the self-aligned manner with respect to the gate electrode GHp of the second pMIS region.

Although the respective first n-type diffusion layers 8 and 29 of the first nMIS and the second nMIS are formed in different steps, they may be formed in the same step. In addition, although the respective first p-type diffusion layers 12 and 30 of the first pMIS and the second pMIS are formed in different steps, they may be formed in the same step.

<Sidewall Forming Step>

Figure 24:
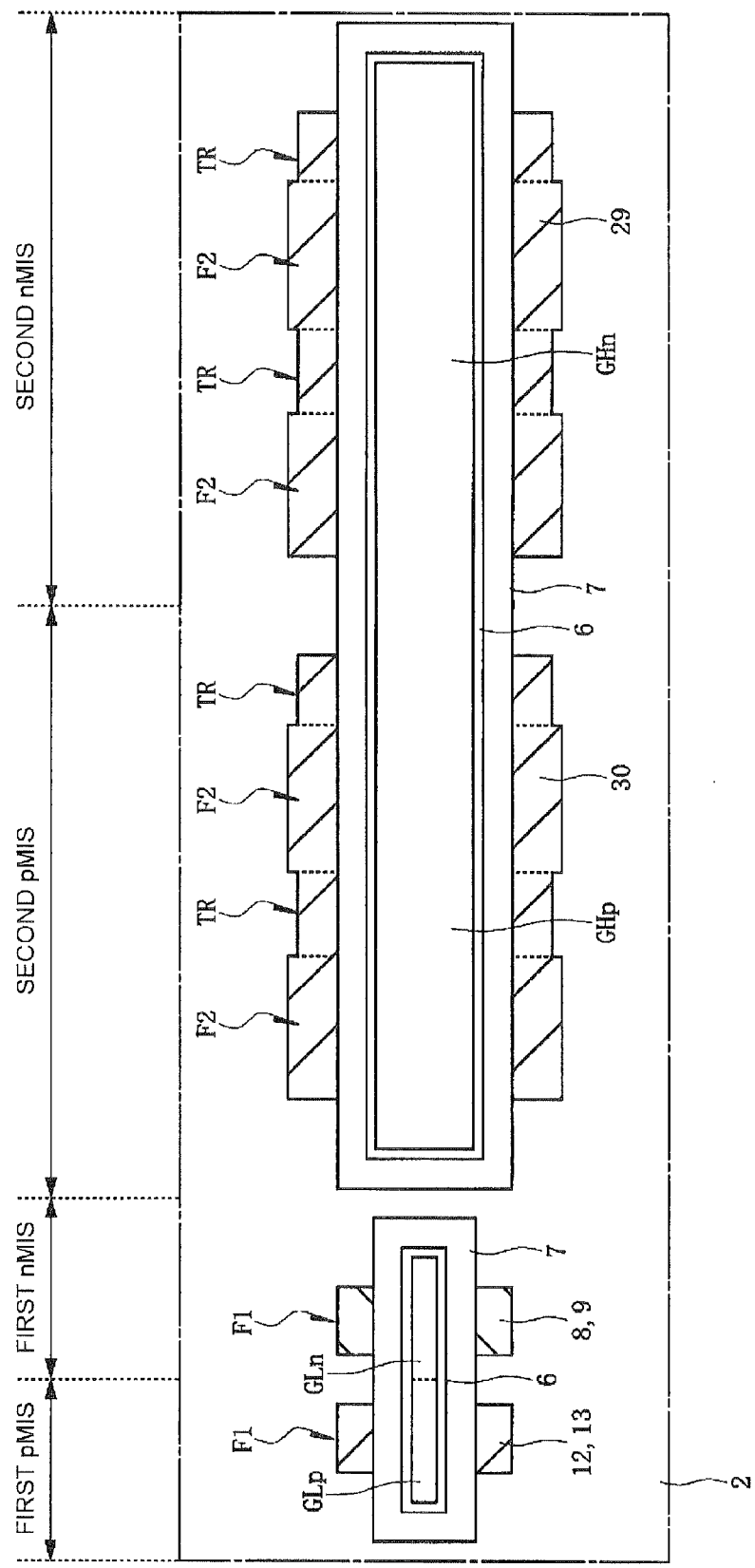
FIG. 24 is a main part plan view of the same point as in FIG. 21 during a manufacturing step of the semiconductor device subsequent to FIG. 23.

Next, as shown in FIG. 24, the sidewall 7 is formed through the offset sidewall 6 on the side surfaces of the gate electrode GLn of the first nMIS, the gate electrode GLp of the first pMIS, the gate electrode GHn of the second nMIS, and the gate electrode GHp of the second pMIS.

<Source/Drain Diffusion Layer Forming Step>

Figure 25:
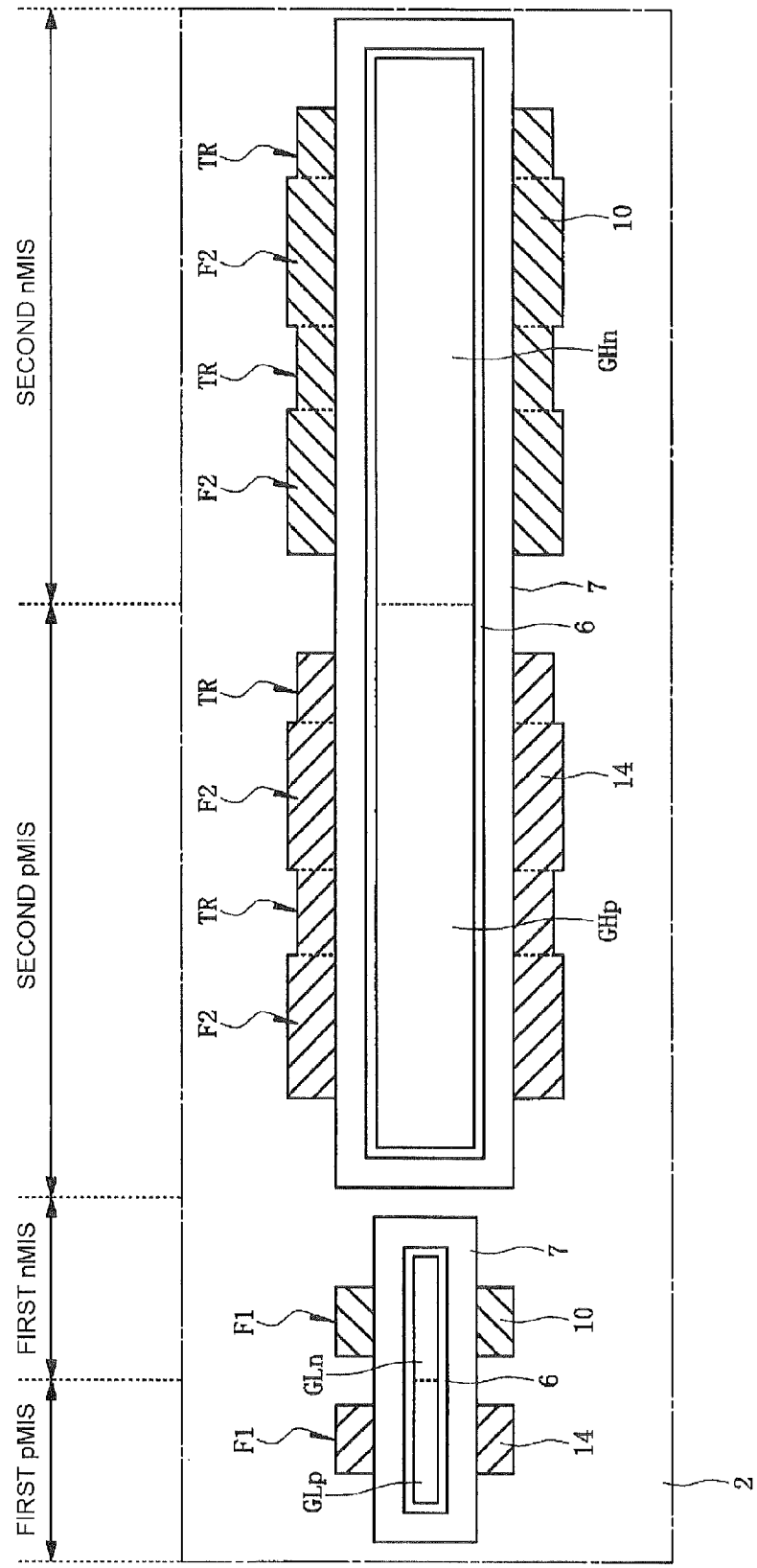
FIG. 25 is a main part plan view of the same point as in FIG. 21 during a manufacturing step of the semiconductor device subsequent to FIG. 24.

Subsequently, as shown in FIG. 25, the n-type impurity is ion-implanted on the surface of the first convex portion F1 of the first nMIS region and the surfaces of the second convex portion F2 and the trench portion TR of the second nMIS region, to form the second n-type diffusion layer 10 in the self-aligned manner with respect to the gate electrode GLn of the first nMIS and the gate electrode GHn of the second nMIS region, respectively. Similarly, the p-type impurity is ion-implanted on the surface of the first convex portion F1 of the first pMIS region and the surfaces of the second convex portion F2 and the trench portion TR of the second pMIS region, to form a second p-type diffusion layer 14 in the self-aligned manner with respect to the gate electrode GLp of the first pMIS and the gate electrode GHp of the second pMIS region, respectively.

As a result, the source/drain of the first nMIS is constituted by the first n-type diffusion layer 8 and the second n-type diffusion layer 10, and the source/drain of the first pMIS is constituted by the first p-type diffusion layer 12 and the second p-type diffusion layer 14. Further, the source/drain of the second nMIS is constituted by the first n-type diffusion layer 29 and the second n-type diffusion layer 10, and the source/drain of the second pMIS is constituted by the first p-type diffusion layer 30 and the second p-type diffusion layer 14.

Although the respective second n-type diffusion layers 10 of the first nMIS and the second nMIS are formed in the same step, they may be formed in different steps. In addition, although the respective second p-type diffusion layers 14 of the first pMIS and the second pMIS are formed in the same step, they may be formed in different steps.

<Silicide Film Forming Step>

Figure 26:
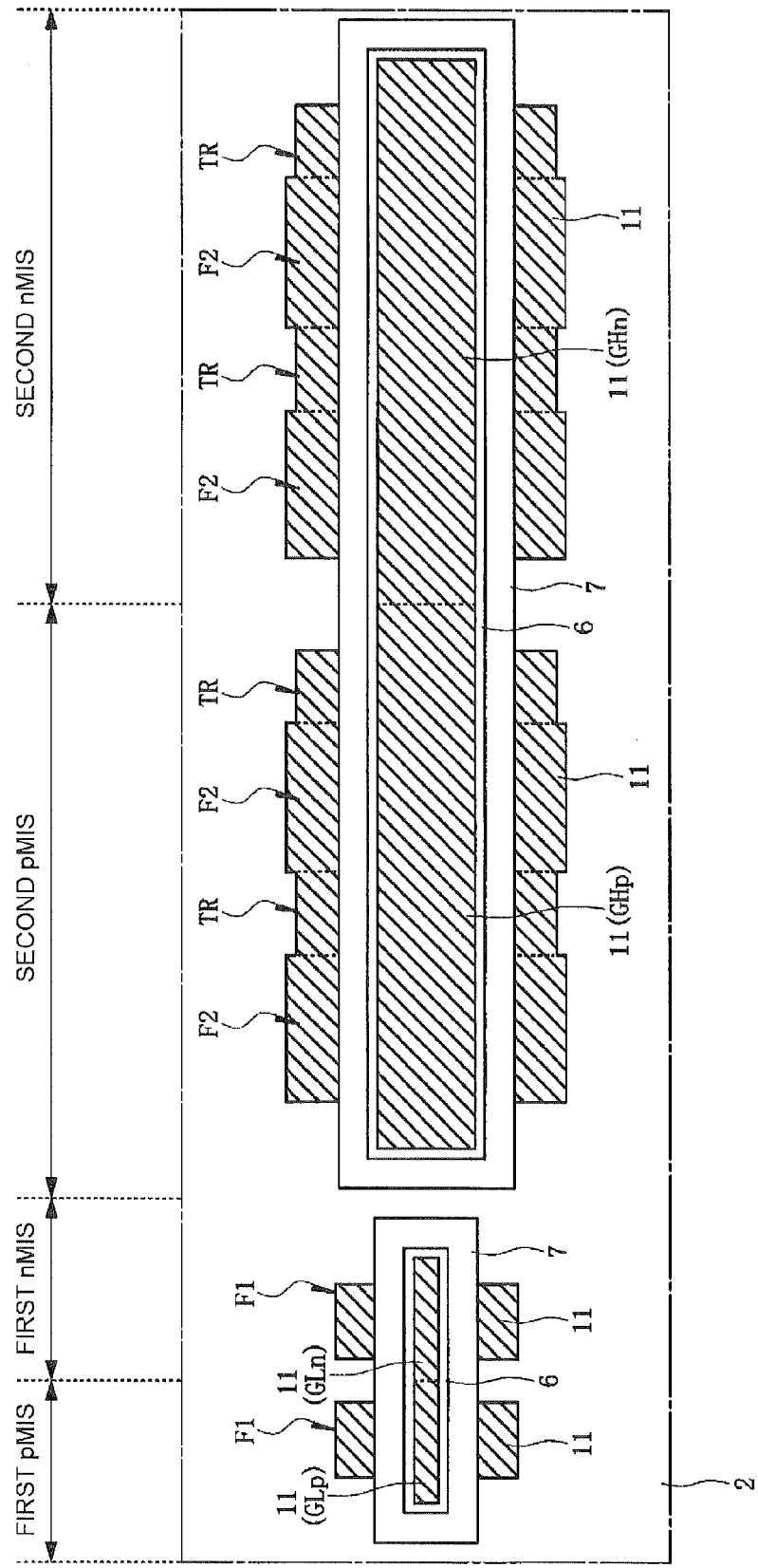
FIG. 26 is a main part plan view of the same point as in FIG. 21 during a manufacturing step of the semiconductor device subsequent to FIG. 25.

Next, as shown in FIG. 26, for the purpose of lower resistance, the silicide film 11 is formed on the surface of the first convex portion F1 formed with the second n-type diffusion layer 10 of the first nMIS, the surface of the first convex portion F1 formed with the second p-type diffusion layer 14 of the first pMIS, the surfaces of the second convex portion F2 and the trench TR formed with the second n-type diffusion layer 10 of the second nMIS, and the surfaces of the second convex portion F2 and the trench TR formed with the second p-type diffusion layer 14 of the second pMIS. Simultaneously, the silicide film 11 is formed also on a top surface of the gate electrode GLn of the first nMIS, a top surface of the gate electrode GLp of the first pMIS, a top surface of the gate electrode GHn of the second nMIS, and a top surface of the gate electrode GHp of the second nMIS.

<Interlayer Film Forming Step>

Next, as shown in the above-mentioned FIGS. 2 and 3, the interlayer film 15 is deposited on the whole area of the main surface of the semiconductor substrate 1, and the surface is planarized, for example by the CMP method.

<Contact Forming Step>

Subsequently, the contact hole 16 is formed in a predetermined point of the interlayer film 15, and a metal film, for example, W (tungsten) or the like is buried inside the contact hole to form the plug 17.

<Wiring Layer Forming Step>

Next, formed is the wiring layer 18 that is electrically connected to the plug 17 formed inside the contact hole 16.

With the above-explained manufacturing processes, the semiconductor device according to the first embodiment is substantially accomplished.

As described above, according to the first embodiment, areas of the first nMIS, the first pMIS, the second nMIS, and the second pMIS in the top view can be made smaller than the area of the planar-type MIS in the related art. Accordingly, for example, a core transistor formed in the logic circuit of the MCU is constituted by the first nMIS and the first pMIS, an HV transistor formed in the I/O circuit of the MCU is constituted by the second nMIS and the second pMIS, and thereby the respective circuit areas can be reduced, so that the whole area of the semiconductor chip where the MCU is formed can be reduced.

Second Embodiment

A different point from the above-mentioned first embodiment lies in a gate structure. Namely, although in the above-mentioned first embodiment, the respective gate electrodes of the first nMIS, the first pMIS, the second nMIS, and the second pMIS are constituted by polycrystalline Si, in the second embodiment, the respective gate electrodes of the first nMIS, the first pMIS, the second nMIS, and the second pMIS are constituted by a metal film.

Figure 27:
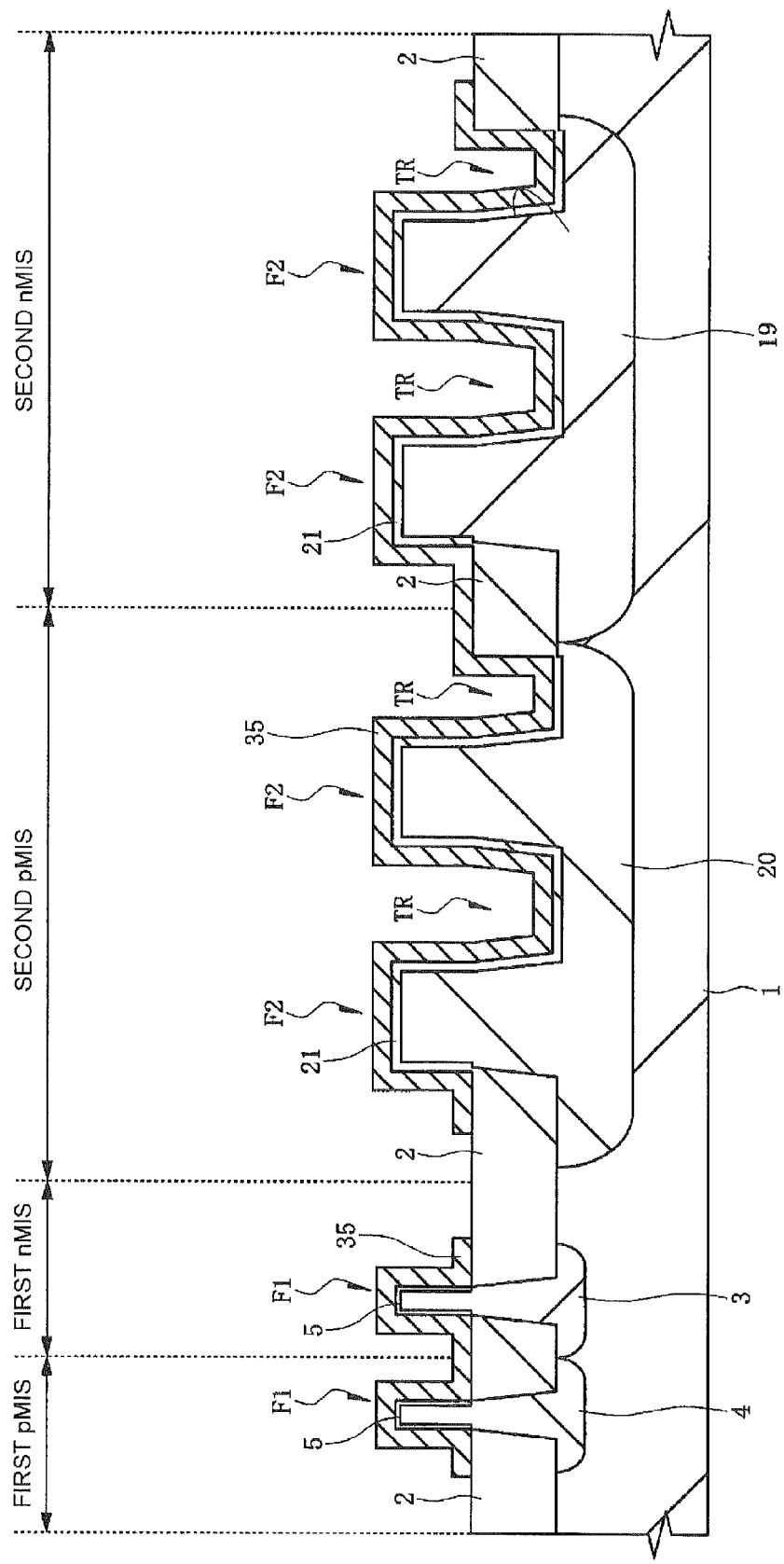
FIG. 27 is a main part sectional view of a semiconductor device according to a second embodiment of the present invention.

A semiconductor device according to the second embodiment will be explained using a main part sectional view shown in FIG. 27. FIG. 27 is the main part sectional view taken along the line A1-A2 of FIG. 1 used in the above-mentioned first embodiment.

In the above-mentioned first embodiment, for example, as shown in the above-mentioned FIG. 20, the gate electrodes GLn and GHn of the first nMIS and the second nMIS are constituted by the conductive film 34n including n-type polycrystalline Si, and the gate electrodes GLp and GHp of the first pMIS and the second pMIS are constituted by the conductive film 34p including p-type polycrystalline Si.

In contrast with this, in the second embodiment, as shown in FIG. 27, the gate electrodes GLn, GLp, GHn, and GHp of the first nMIS, the first pMIS, the second nMIS, and the second pMIS are constituted by a metal film 35, such as a TiN (titanium nitride) film or a TaN (tantalum nitride) film. The thicknesses of the gate electrodes GLn, GLp, GHn, and GHp are set thinner than a half of a distance between the adjacent first convex portions F1 formed in the first nMIS region and the first pMIS region, and it is, for example, approximately 10 to 30 nm. This is because when the metal film 35 is buried between the adjacent first convex portions F1, it becomes difficult to process the metal film 35.

According to the second embodiment, depletion of the gate electrodes GLn, GLp, GHn, and GHp can be suppressed as compared with the above-mentioned first embodiment in which polycrystalline Si is used for the gate electrodes GLn; GLp, GHn, and GHp. As a result, particularly in the first nMIS and the first pMIS, improvement in the transistor characteristics (for example, suppression of the short channel effect, increase of a drain current) can be achieved more than in the first nMIS and the first pMIS of the above-mentioned first embodiment.

Since the gate insulating film 21 is thick enough to have a thickness of approximately 15 nm in the second nMIS and the second pMIS, an effect for suppressing the depletion of the gate electrodes GHn and GHp by using the metal film 35 is relatively smaller compared with the effect in the first nMIS and the first pMIS, but it still remains to have an advantage.

In addition, in the second nMIS and the second pMIS, a substantial gate width can be increased by forming the trench portion TR and further, when a pitch of the trench portion TR is narrowed, vertical surfaces (the side surface of the second convex portion F2 and the side surface of the trench portion TR) of the channel increase, so that a total substantial gate width of the vertical surfaces and horizontal surfaces (the top surface of the second convex portion F2 and the bottom surface of the trench portion TR) can be increased. At this time, since the width of the trench portion TR becomes narrow, depletion of the polycrystalline Si of the bottom portion of the trench portion TR is accelerated when polycrystalline Si is used for the gate electrodes GHn and GHp. Namely, although in the second nMIS, the n-type impurity (for example, P) is introduced into non-doped amorphous Si by the ion implantation method to form an n-type conductive film, and in the second pMIS, the p-type impurity (for example, B) is introduced into non-doped amorphous Si by the ion implantation method to form a p-type conductive film, when an aspect ratio of the trench portion TR becomes large, there is a concern that these impurities are not introduced down to the bottom portion of the trench portion TR, and that the impurities cannot be sufficiently diffused even by the subsequent heat treatment. If polycrystalline Si in which the n-type impurity or the p-type impurity has been previously doped is used, depletion of one of the second nMIS or the second pMIS can be suppressed, but conversely, depletion of the other is accelerated.

Accordingly, in order to suppress depletion of the gate electrodes GHn and GHp at the same time when the pitch of the trench portion TR is narrowed to thereby increase the substantial gate width, it is more advantageous to use the metal film 35 than to use polycrystalline Si for the gate electrodes GHn and GHp in order to obtain good transistor characteristics in the second nMIS and the second pMIS.

Third Embodiment

A different point from the above-mentioned first embodiment lies in a gate structure. Namely, in the above-mentioned first embodiment, the respective gate electrodes GLn, GLp, GHn, and GHp of the first nMIS, the first pMIS, the second nMIS, and the second pMIS are constituted by polycrystalline Si, and the gate insulating films 5 and 21 are constituted by the oxide film. In contrast with this, in the third embodiment, the gate electrodes GLn and GLp of the first nMIS and the first pMIS are constituted by a metal film, and a gate insulating film is constituted by a stacked film including a High-k material. In addition, the gate electrodes GHn and GHp of the second nMIS and the second pMIS are constituted by the metal film, and the gate insulating film is constituted by the oxide film.

Figure 28:
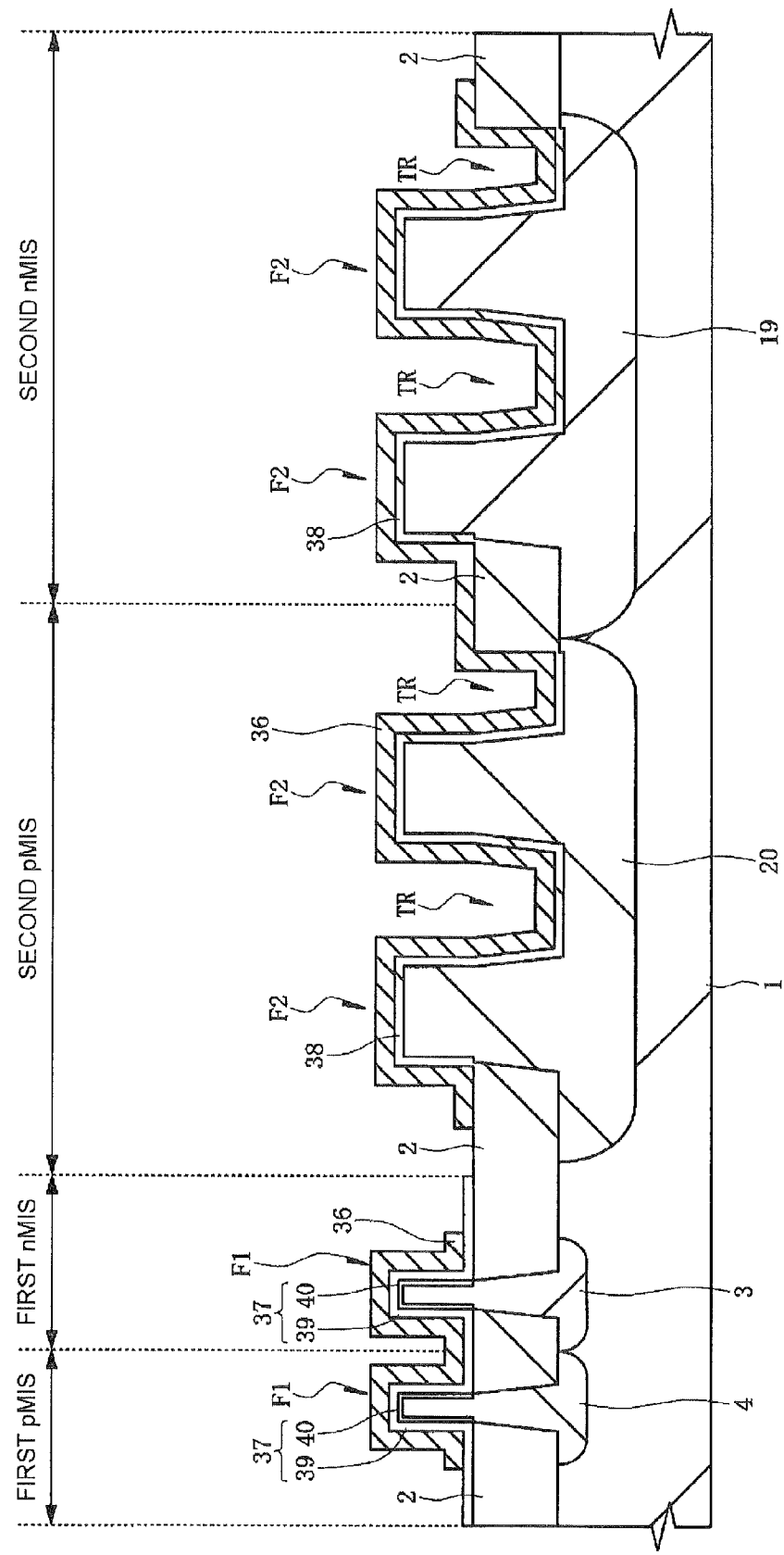
FIG. 28 is a main part sectional view of a semiconductor device according to a third embodiment of the present invention.

A semiconductor device according to the third embodiment will be explained using a main part sectional view shown in FIG. 28. FIG. 28 is the main part sectional view taken along the line A1-A2 of FIG. 1 used in the above-mentioned first embodiment.

In the above-mentioned first embodiment, for example, as shown in the above-mentioned FIG. 20, the gate electrodes GLn and GHn of the first nMIS and the second nMIS are constituted by the conductive film 34n including n-type polycrystalline Si, and the gate electrodes GLp and GHp of the first pMIS and the second pMIS are constituted by the conductive film 34p including p-type polycrystalline Si. Further, the gate insulating film 5 of the first nMIS and the first pMIS is, for example, constituted by an oxide film having a thickness of approximately 2 to 3 nm, and the gate insulating film 21 of the second nMIS and the second pMIS is, for example, constituted by an oxide film having a thickness of approximately 15 nm.

In contrast with this, in the third embodiment, as shown in FIG. 28, the gate electrodes GLn, GLp, GHn, and GHp of the first nMIS, the first pMIS, the second nMIS, and the second pMIS are constituted by a metal film 36, for example, the TiN film or the TaN film. The thicknesses of the gate electrodes GLn, GLp, GHn, and GHp are set thinner than a half of a distance between the adjacent first convex portions F1 formed in the first nMIS region and the first pMIS region, and it is, for example, approximately 10 to 30 nm. This is, as explained in the above-mentioned second embodiment, because when the metal film 36 is buried between the adjacent first convex portions F1, it becomes difficult to process the metal film 36. Further, a gate insulating film 37 of the first nMIS and the first pMIS includes a High-k material 39, such as an $HfO_x$ (hafnium oxide) film, an HfON (hafnium oxynitride) film, an $HfSiO_x$ (hafnium silicon oxide) film, or an HfSiON (hafnium silicon oxynitride) film, and it is constituted by a stacked film of an oxide film 40 having a thickness of approximately 1 to 3 nm and the High-k material 39. A gate insulating film 38 of the second nMIS and the second pMIS does not include the above-described High-k material, and it is constituted by an oxide film having a thickness of approximately 15 nm.

According to the third embodiment, in the first nMIS and the first pMIS, a gate leakage current increased due to a tunnel effect is suppressed by including the High-k material 39 in the gate insulating film 37, and improvement in drive capability (lower electric power, a higher drain current) can be achieved by thinning an EOT (Equivalent Oxide Thickness) to thereby improve a gate capacitance.

Meanwhile, in the second nMIS and the second pMIS, deterioration of a noise characteristic of an analog element can be prevented by not including the High-k material 39 in the gate insulating film 38. This is because the High-k material 39 generally has many traps and the noise characteristic of the analog element is easy to be impaired.

For example, the core transistor formed in the logic circuit of the MCU is constituted by the first nMIS and the first pMIS using the gate insulating film 37 including the High-k material 39 that can achieve improvement in drive capability. In addition, since the HV transistor formed in the I/O circuit of the MCU is often used for analog, it is constituted by the second nMIS and the second pMIS using the gate insulating film 38 not including the High-k material 39 that can achieve a lower noise. It is to be noted that since the core transistor is hardly required to be low-noise, there is no problem if the core transistor is constituted by the first nMIS and the first pMIS using the gate insulating film 37 including the High-k material 39.

Next, a method of manufacturing a semiconductor device according to the third embodiment will be explained in step order using FIGS. 29 to 32. FIGS. 29 to 32 are main part sectional views of the first nMIS, the first pMIS, the second nMIS, and the second pMIS during the manufacturing steps of the semiconductor device. Each drawing shows a main part cross section (the above-mentioned sectional view taken along the line A1-A2 of FIG. 1) obtained by cutting the channel along the gate width direction of each gate electrode.

<Gate Insulating Film Forming Step>

Since manufacturing processes (the above-mentioned steps explained using FIG. 19) until the gate insulating film 38 and the oxide film 40 are formed after the first convex portion F1, the second convex portion F2, and the trench portion TR are formed are similar to those of the above-mentioned first embodiment, explanation thereof will be omitted. The gate insulating film 38 is, for example, formed similarly to the gate insulating film 21 explained in the above-mentioned first embodiment, and the oxide film 40 is, for example, formed similarly to the gate insulating film 5 explained in the above-mentioned first embodiment.

Figure 29:
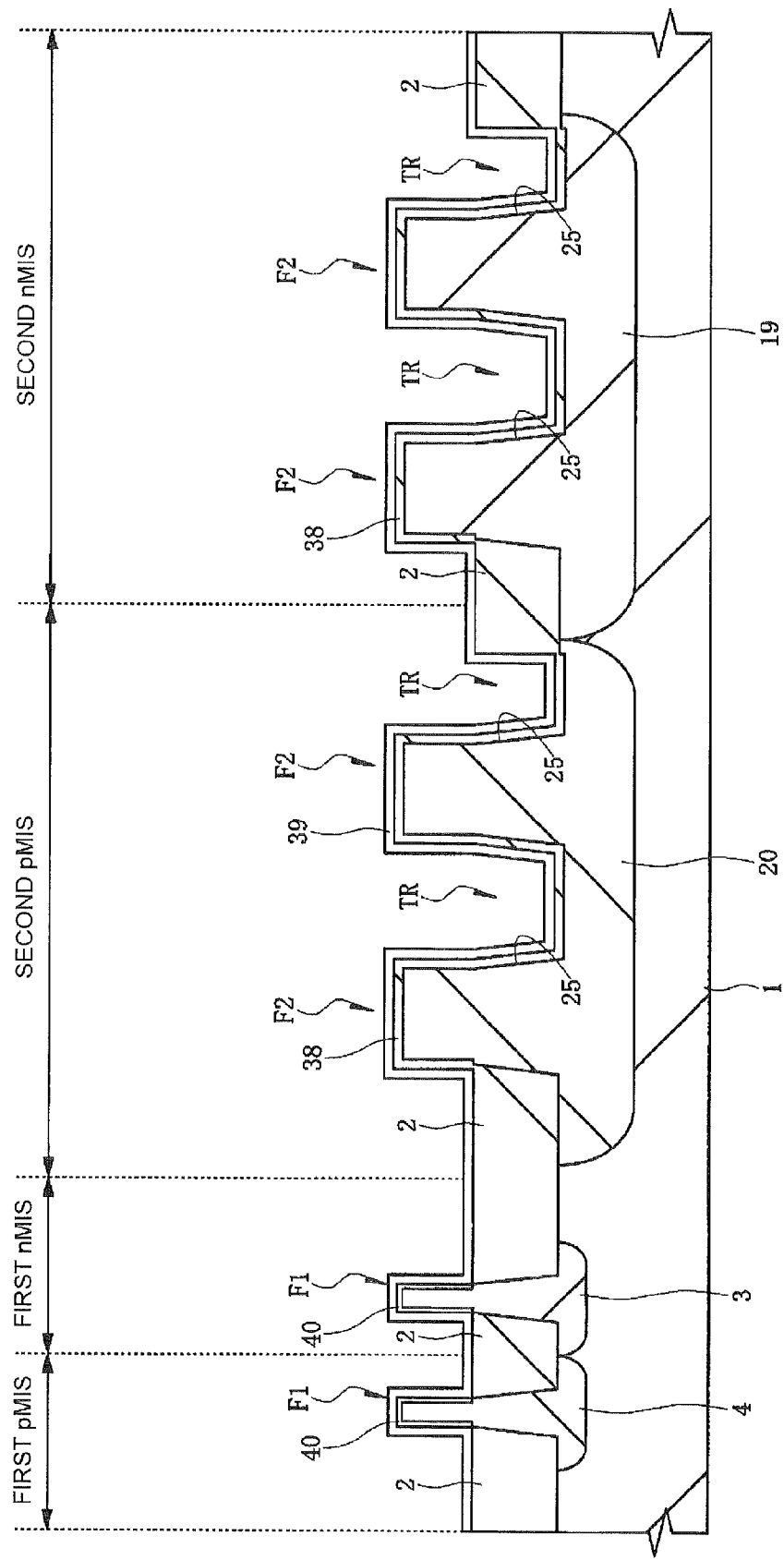
FIG. 29 is a main part sectional view of a semiconductor substrate showing a manufacturing step of the semiconductor device according to the third embodiment of the present invention.

Subsequent to the above-mentioned steps explained using FIG. 19, as shown in FIG. 29, the High-k material 39, such as the $HfO_x$ film, the HfON film, the $HfSiO_x$ film, or the HfSiON film, is formed over the main surface of the semiconductor substrate 1. The High-k material 39 is, for example, formed using the CVD method or an ALD (Atomic Layer Deposition) method.

Figure 30:
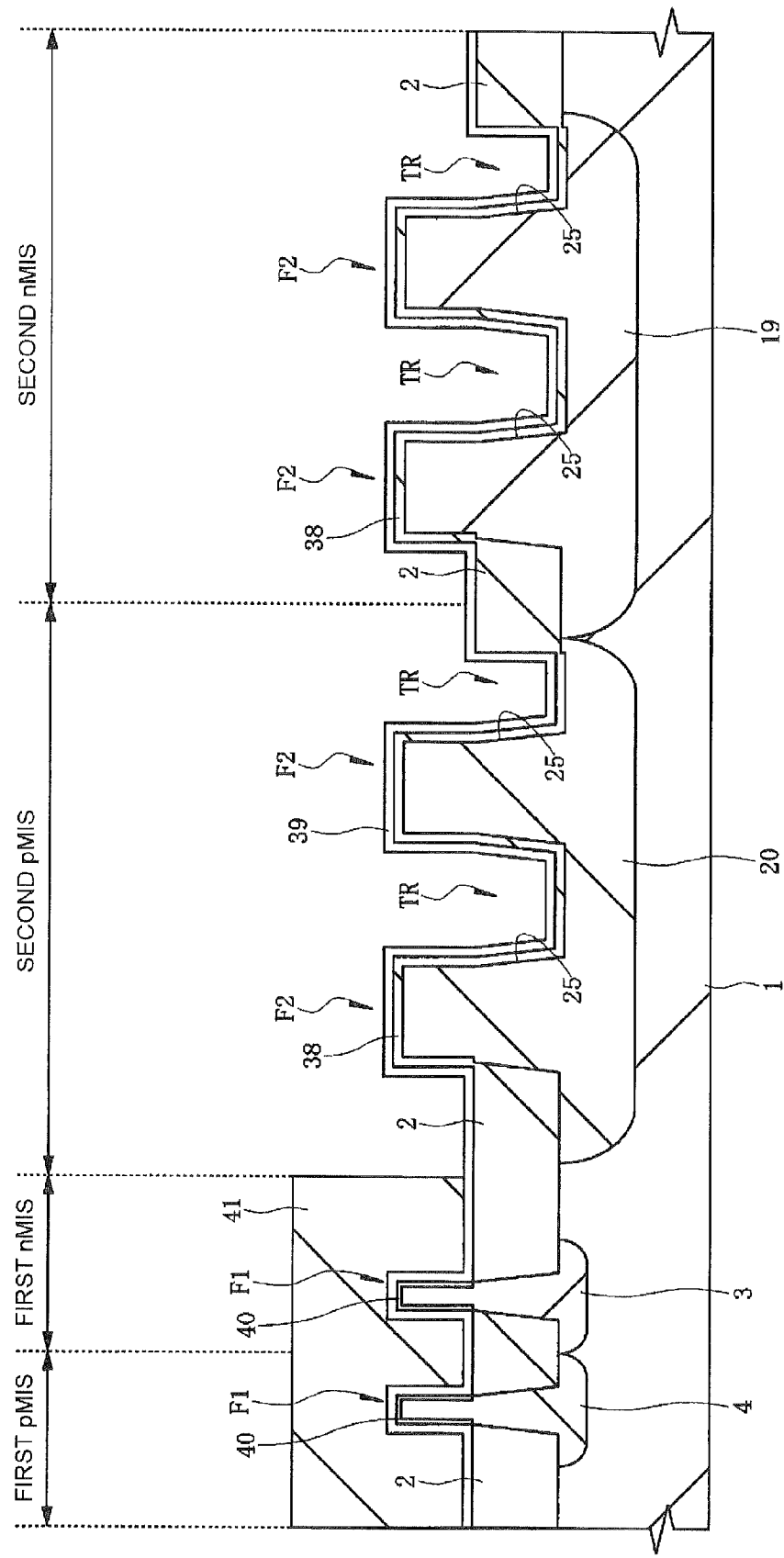
FIG. 30 is a main part sectional view of a same point as in FIG. 29 during a manufacturing step of the semiconductor device subsequent to FIG. 29.

Next, as shown in FIG. 30, regions of the first nMIS region and the first pMIS region that require the High-k material 39 are covered with a resist pattern 41, and the High-k material 39 exposed from the resist pattern 41 is etched by the wet etching method using hydrofluoric acid solution, the dry etching method, or by appropriately combining these methods.

Figure 31:
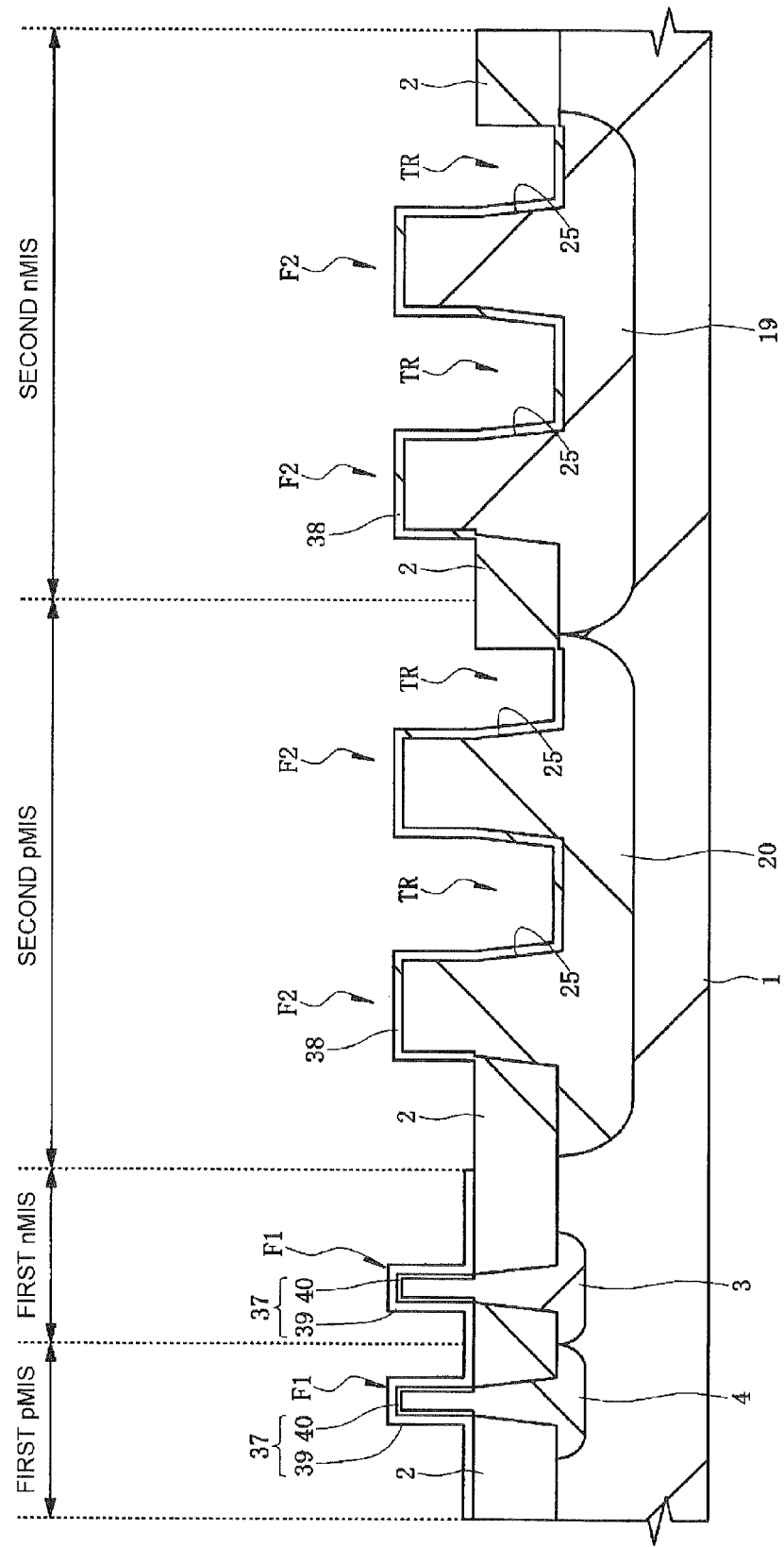
FIG. 31 is a main part sectional view of the same point as in FIG. 29 during a manufacturing step of the semiconductor device subsequent to FIG. 30.

Subsequently, as shown in FIG. 31, the resist pattern 41 is removed. After that, heat treatment is performed, and the High-k material 39 may be diffused in the gate insulating films 40 of the first nMIS and the first pMIS. As a result, the gate insulating film 37 including the stacked film of the oxide film 40 and the High-k material 39 is formed in the first nMIS region and the first pMIS region.

<Gate Electrode Forming Step>

Figure 32:
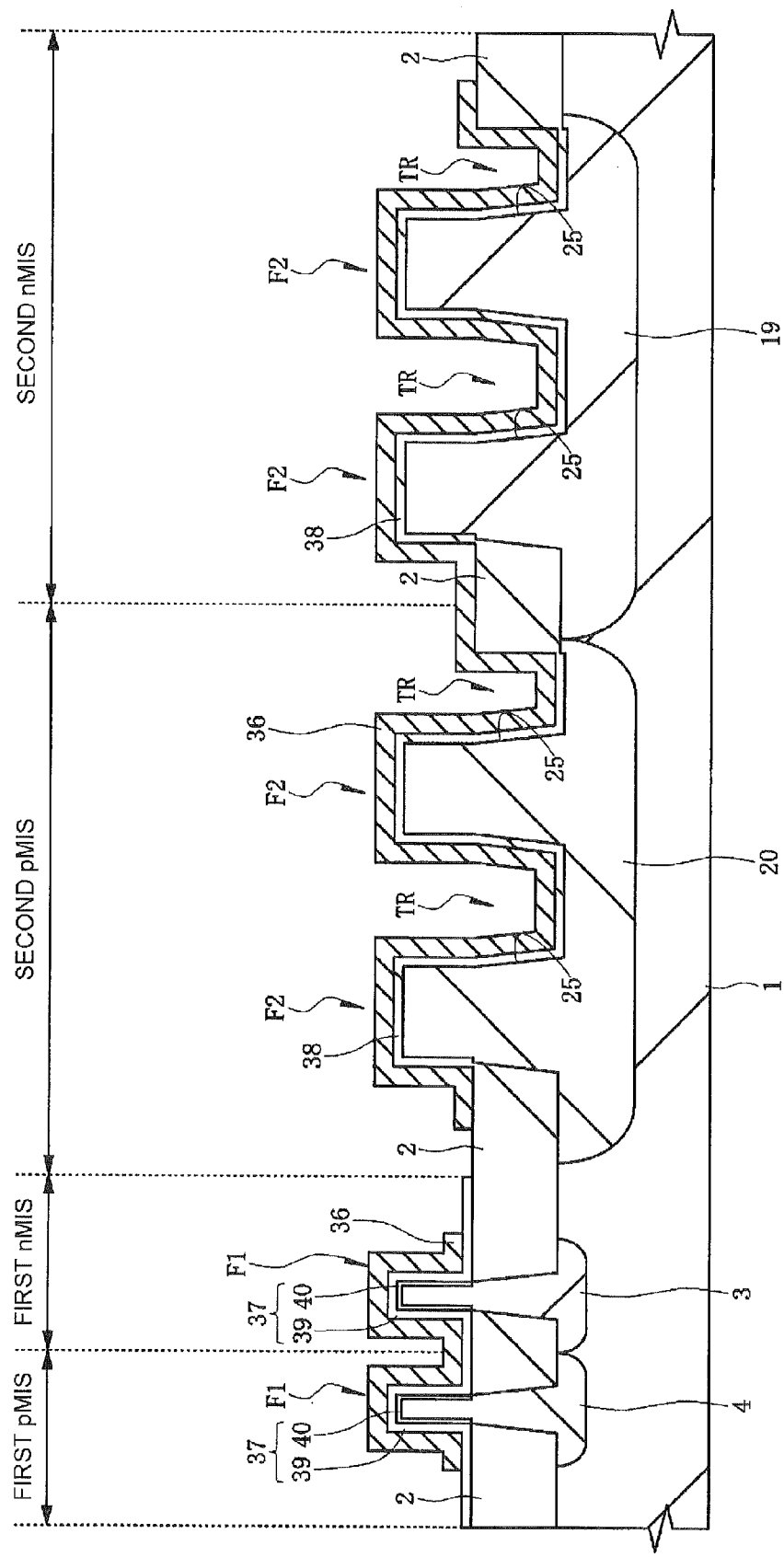
FIG. 32 is a main part sectional view of the same point as in FIG. 29 during a manufacturing step of the semiconductor device subsequent to FIG. 31.

Next, as shown in FIG. 32, the metal film 36, such as the TiN film or the TaN film, is formed over the main surface of the semiconductor substrate 1. A thickness of the metal film 36 is set thinner than a half of a distance between the adjacent first convex portions F1 formed in the first nMIS region and the first pMIS region, and it is, for example, approximately 10 to 30 nm.

Subsequently, the metal film 36 exposed from the resist pattern is removed by using the resist pattern as a mask, for example, using the dry etching method, and formed are the gate electrode GLn of the first nMIS, the gate electrode GLp of the first pMIS, the gate electrode GHn of the second nMIS, and the gate electrode GHp of the second pMIS.

After that, similarly to the above-mentioned first embodiment, the semiconductor device according to the third embodiment is substantially accomplished through the offset sidewall forming step, epitaxial silicon layer forming step, halo diffusion layer forming step, diffusion layer forming step, sidewall forming step, source/drain diffusion layer forming step, silicide film forming step, interlayer film forming step, contact forming step, and wiring layer forming step.

Hereinbefore, the invention made by the inventors has been specifically explained based on the embodiments, but the present invention is not limited to the above-described embodiments, and it is needless to say that various changes can be made without departing from the gist of the invention.

For example, in the above-described embodiments, the case has been explained where the invention made by the inventors is applied to the MCU that is an application field as the background of the invention, but the present invention is not limited to this, and it can be applied to a semiconductor product in which a low-voltage field effect transistor and a high-voltage field effect transistor are formed in a same semiconductor chip.

The present invention can be applied to semiconductor products, such as an SoC.

What is claimed is:

1. A semiconductor device comprising:
an element isolation portion including an insulating film formed on a main surface of a semiconductor substrate;
a first field effect transistor formed in a first active region surrounded by the element isolation portion; and
a second field effect transistor which includes a second gate electrode and is surrounded by the element isolation portion and formed in a second active region different from the first active region,
wherein the first active region includes a first convex portion of the semiconductor substrate that projects from a surface of the element isolation portion,
wherein the second active region includes a second convex portion of the semiconductor substrate that projects from the surface of the element isolation portion, and a trench portion formed in the semiconductor substrate, the second gate electrode being formed in the trench portion, wherein a height of the second convex portion from the surface of the element isolation portion and a height of the first convex portion from the surface of the element isolation portion are the same as each other, wherein a depth of the trench portion from a height of the surface of the element isolation portion to a bottom surface of the trench portion, is the same as a length of the second gate electrode from the height of the surface of the element isolation portion to the bottom surface of the trench portion, and the same as a thickness of the element isolation portion, and wherein a thickness of a first gate insulating film of the first field effect transistor is less than a thickness of a second gate insulating film of the second field effect transistor, a first gate length of the first field effect transistor is less than a second gate length of the second field effect transistor, and a first width of the first convex portion in a gate width direction in a top view is less than a second width of the second convex portion in the gate width direction in a top view.

2. The semiconductor device according to claim 1, wherein a first operating voltage of the first field effect transistor is lower than a second operating voltage of the second field effect transistor.

3. The semiconductor device according to claim 1, wherein the height of the first convex portion from the surface of the element isolation portion and the depth of the trench portion from the surface of the element isolation portion are the same as each other.

4. The semiconductor device according to claim 1, wherein the second convex portion comprises a plurality of second convex portions and the trench portion comprises a plurality of trench portions.

5. The semiconductor device according to claim 4, wherein the plurality of second convex portions and the plurality of trench portions are alternately formed in a gate width direction in the second active region.

6. The semiconductor device according to claim 4, wherein a second convex portion of the plurality of second convex portions is formed at one end of the second active region in a gate width direction, and the trench portion is formed at the other end thereof.

7. The semiconductor device according to claim 4, wherein the plurality of second convex portions are formed at both ends of the second active region in a gate width direction.

8. The semiconductor device according to claim 4, wherein the plurality of trench portions are formed at both ends of the second active region in a gate width direction.

9. The semiconductor device according to claim 1, wherein a first gate electrode of the first field effect transistor and the second gate electrode of the second field effect transistor include a metal film.

10. The semiconductor device according to claim 1, wherein the first gate insulating film of the first field effect transistor includes a stacked film containing a High-k material, and wherein the second gate insulating film of the second field effect transistor includes an oxide film, and wherein a first gate electrode of the first field effect transistor and the second gate electrode of the second field effect transistor include a metal film.

11. The semiconductor device according to claim 1, wherein the second gate insulating film includes a first portion formed on an upper surface of the second convex portion and a second portion formed on the bottom surface of the trench portion, a thickness of the first portion being substantially the same as a thickness of the second portion.

12. The semiconductor device according to claim 11, wherein the second gate insulating film further includes a third portion formed on a side surface of the trench portion, the second gate electrode contacting the second and third portions of the second gate insulating film, such that the bottom surface and the side surface of the trench portion comprise a channel through which a drain current flows.

13. The semiconductor device according to claim 1, wherein a length of the second gate electrode in the trench portion is substantially the same as the depth of the trench portion.

14. The semiconductor device according to claim 1, wherein the second convex portion comprises a plurality of second convex portions and the trench portion is formed between the plurality of second convex portions, and wherein the second gate insulating film and the second gate electrode are formed continuously on the plurality of second convex portions and in the trench portion.

15. A semiconductor device comprising:
a first field effect transistor comprising:
a first convex portion formed in a first active region of a semiconductor substrate;
a first gate insulating film formed on the first convex portion; and
a first gate electrode formed on the first gate insulating film;
a second field effect transistor including a gate length which is greater than a gate length of the first field effect transistor, the second field effect transistor comprising:
a second convex portion formed in a second active region of the semiconductor substrate which is different from the first active region, a width of the second convex portion being greater than a width of the first convex portion, and a height of the second convex portion being the same as a height of the first convex portion;
a second gate insulating film formed on the second convex portion, a thickness of the second gate insulating film being greater than a thickness of the first gate insulating film; and
a second gate electrode formed on the second gate insulating film and on the second convex portion and in a trench portion of the semiconductor substrate, such that a channel region of the second field effect transistor is formed in the second convex portion and the trench portion; and
an element isolation layer formed on the semiconductor substrate and surrounding the first and second active regions, the first gate electrode contacting a surface of the element isolation layer and the second gate electrode extending below the surface of the element isolation layer in the trench portion and contacting the second gate insulating film, such that a depth of the trench portion from a height of the surface of the element isolation layer to a bottom surface of the trench portion, is the same as a length of the second gate electrode from the height of the surface of the element isolation layer to the bottom surface of the trench portion, and the same as a thickness of the element isolation portion.

16. A semiconductor device comprising:
a first field effect transistor comprising:
- a first convex portion formed in a first active region of a semiconductor substrate;
- a first gate insulating film formed on the first convex portion; and
- a first gate electrode formed on the first gate insulating film;

a second field effect transistor including a gate length which is greater than a gate length of the first field effect transistor, the second field effect transistor comprising:
- a plurality of second convex portions formed in a second active region of the semiconductor substrate which is different from the first active region, a width of a second convex portion of the plurality of second convex portions being greater than a width of the first convex portion, and a height of the second convex portion being the same as a height of the first convex portion;
- a second gate insulating film formed on the plurality of second convex portions, a thickness of the second gate insulating film being greater than a thickness of the first gate insulating film; and
- a second gate electrode formed on the second gate insulating film and on the plurality of second convex portions and in a trench portion of the semiconductor substrate which is formed between the plurality of second convex portions, such that a channel region of the second field effect transistor is formed in the plurality of second convex portions and the trench portion; and an element isolation layer formed on the semiconductor substrate and surrounding the first and second active regions, the first gate electrode contacting a surface of the element isolation layer and the second gate electrode extending below the surface of the element isolation layer in the trench portion and contacting the second gate insulating film, such that a depth of the trench portion from a height of the surface of the element isolation layer to a bottom surface of the trench portion, is the same as a length of the second gate electrode from the height of the surface of the element isolation layer to the bottom surface of the trench portion, and the same as a thickness of the element isolation portion.

* * * * *